US012674083B2

(12) United States Patent
Park et al.

(10) Patent No.: US 12,674,083 B2
(45) **Date of Patent: *Jul. 7, 2026**

(54) PRESSURE-SENSITIVE ADHESIVE LAYER

(71) Applicant: LG CHEM, LTD., Seoul (KR)

(72) Inventors: Byung Su Park, Daejeon (KR); Hyun Cheol Kim, Daejeon (KR); Hyon Gyu Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 499 days.

This patent is subject to a terminal disclaimer.

(21) Appl. No.: 17/783,803

(22) PCT Filed: Dec. 10, 2020

(86) PCT No.: PCT/KR2020/018041

§ 371 (c)(1),
(2) Date: Jun. 9, 2022

(87) PCT Pub. No.: WO2021/118250

PCT Pub. Date: Jun. 17, 2021

(65) Prior Publication Data

US 2023/0029530 A1 Feb. 2, 2023

(30) Foreign Application Priority Data

Dec. 10, 2019 (KR) ........................ 10-2019-0164158
Dec. 13, 2019 (KR) ........................ 10-2019-0167239

(51) Int. Cl.
*C09J 133/10* (2006.01)
*B32B 5/14* (2006.01)
(Continued)

(52) U.S. Cl.
CPC ............ *C09J 133/10* (2013.01); *B32B 5/142* (2013.01); *B32B 5/147* (2013.01); *B32B 7/12* (2013.01);
(Continued)

(58) Field of Classification Search
CPC .... C08K 5/07; C09J 11/00; C09J 11/06; C09J 133/08; C09J 133/10; C09J 2203/318;
(Continued)

(56) References Cited

U.S. PATENT DOCUMENTS

2005/0238997 A1 10/2005 De et al.
2008/0139689 A1 6/2008 Huang et al.
(Continued)

FOREIGN PATENT DOCUMENTS

CN 106244062 A 12/2016
CN 107683314 A 2/2018
(Continued)

OTHER PUBLICATIONS

Franck, A. J. "Characterizing PSAs by Rheology," Jun. 2005, Adhesives & Sealants Industry magazine. (Year: 2005).*
(Continued)

*Primary Examiner* — Philip C Tucker
*Assistant Examiner* — Brian R Slawski
(74) *Attorney, Agent, or Firm* — Ricky Lam

(57) ABSTRACT

The present application provides a pressure-sensitive adhesive layer comprising at least first and second regions having different physical properties, wherein the difference in physical properties, such as an elastic modulus or creep strain rate is maintained relatively large for each region, and the difference in physical properties, such as a peel force or recovery rate is maintained relatively small for each region.

11 Claims, 5 Drawing Sheets

(51) Int. Cl.

| | |
|---|---|
| ***B32B 7/12*** | (2006.01) |
| ***C08F 220/18*** | (2006.01) |
| ***C09J 7/10*** | (2018.01) |
| ***C09J 7/20*** | (2018.01) |
| ***C09J 7/25*** | (2018.01) |
| ***C09J 7/38*** | (2018.01) |
| ***C09J 7/40*** | (2018.01) |
| ***C09J 11/00*** | (2006.01) |
| ***C09J 11/06*** | (2006.01) |
| ***C09J 133/08*** | (2006.01) |
| ***C09J 133/12*** | (2006.01) |
| ***G02F 1/1333*** | (2006.01) |
| ***G06F 1/16*** | (2006.01) |
| ***G09F 9/30*** | (2006.01) |
| ***H10K 77/10*** | (2023.01) |
| ***H10K 102/00*** | (2023.01) |

(52) U.S. Cl.

CPC ...... *C08F 220/18* (2013.01); *C08F 220/1811* (2020.02); *C08F 220/1812* (2020.02); *C08F 220/1818* (2020.02); *C09J 7/10* (2018.01); *C09J 7/385* (2018.01); *C09J 133/08* (2013.01); *C09J 133/12* (2013.01); *B32B 2307/412* (2013.01); *B32B 2307/51* (2013.01); *B32B 2307/54* (2013.01); *B32B 2307/548* (2013.01); *B32B 2307/704* (2013.01); *B32B 2457/20* (2013.01); *C09J 7/20* (2018.01); *C09J 7/255* (2018.01); *C09J 7/403* (2018.01); *C09J 11/00* (2013.01); *C09J 11/06* (2013.01); *C09J 2203/318* (2013.01); *C09J 2203/326* (2013.01); *C09J 2301/124* (2020.08); *C09J 2301/208* (2020.08); *C09J 2301/21* (2020.08); *C09J 2301/302* (2020.08); *C09J 2301/312* (2020.08); *C09J 2301/408* (2020.08); *C09J 2301/414* (2020.08); *C09J 2301/416* (2020.08); *C09J 2433/00* (2013.01); *C09J 2467/006* (2013.01); *G02F 1/133305* (2013.01); *G02F 2202/28* (2013.01); *G06F 1/1652* (2013.01); *G09F 9/301* (2013.01); *H10K 77/111* (2023.02); *H10K 2102/311* (2023.02); *Y10T 428/24942* (2015.01); *Y10T 428/24983* (2015.01); *Y10T 428/2809* (2015.01); *Y10T 428/2891* (2015.01)

(58) Field of Classification Search

CPC ............ C09J 2301/124; C09J 2301/208; C09J 2301/21; C09J 2301/302; C09J 2301/312; C09J 2301/408; C09J 2301/414; C09J 2301/416; C09J 2433/00; C09J 2467/006; C09J 7/10; C09J 7/20; C09J 7/255; C09J 7/385; C09J 7/40; C09J 7/403; H10K 2102/311; H10K 50/8426; H10K 77/111; Y02P 70/50

USPC ....... 156/60, 325, 327, 332; 428/195.1, 201, 428/1.1, 1.5, 1.55, 212, 343, 345, 355 R, 428/355 AC

See application file for complete search history.

(56) References Cited

U.S. PATENT DOCUMENTS

| | | | |
|---|---|---|---|
| 2011/0149211 A1 | | 6/2011 | Ha et al. |
| 2012/0328800 A1 | | 12/2012 | Yoon et al. |
| 2014/0262002 A1 | | 9/2014 | Suwa et al. |
| 2015/0144913 A1 | | 5/2015 | Shim |
| 2016/0111678 A1 | | 4/2016 | Lee et al. |
| 2017/0121564 A1 | | 5/2017 | Cho et al. |
| 2017/0166786 A1 | * | 6/2017 | Moon .................. C08F 265/06 |
| 2017/0260423 A1 | * | 9/2017 | Son .................. C08F 220/1808 |
| 2018/0119180 A1 | | 5/2018 | Kim et al. |
| 2018/0265748 A1 | | 9/2018 | Behling et al. |
| 2019/0062608 A1 | | 2/2019 | Aloshyna Ep Lesuffleur et al. |
| 2019/0203077 A1 | | 7/2019 | Park et al. |
| 2019/0316004 A1 | | 10/2019 | Clapper et al. |
| 2019/0338165 A1 | | 11/2019 | Choi et al. |
| 2020/0413551 A1 | | 12/2020 | Du |
| 2021/0048567 A1 | | 2/2021 | Kimura et al. |
| 2021/0171802 A1 | | 6/2021 | Kim et al. |

FOREIGN PATENT DOCUMENTS

| | | | |
|---|---|---|---|
| CN | 110041848 | A | 7/2019 |
| CN | 110191797 | A | 8/2019 |
| CN | 110300785 | A | 10/2019 |
| JP | 2012500318 | A | 1/2012 |
| JP | 2017002116 | A | 1/2017 |
| JP | 2017193678 | A | 10/2017 |
| JP | 2018534391 | A | 11/2018 |
| JP | 2019108498 | A | 7/2019 |
| JP | 2019179211 | A | 10/2019 |
| JP | 2019528330 | A | 10/2019 |
| JP | 2020513451 | A | 5/2020 |
| KR | 20110098692 | A | 9/2011 |
| KR | 20150061791 | A | 6/2015 |
| KR | 20160047035 | A | 5/2016 |
| KR | 20170070370 | A | 6/2017 |
| KR | 20170101339 | A | 9/2017 |
| KR | 20180015223 | A | 2/2018 |
| KR | 20180099541 | A | 9/2018 |
| KR | 101983296 | B1 | 5/2019 |
| KR | 20190098435 | A | 8/2019 |
| KR | 20190113633 | A | 10/2019 |
| TW | 200604742 | A | 2/2006 |
| WO | 2013062996 | A1 | 5/2013 |
| WO | 2016196576 | A1 | 12/2016 |
| WO | 2018128381 | A1 | 7/2018 |
| WO | 2018221109 | A1 | 12/2018 |
| WO | 2019066528 | A1 | 4/2019 |
| WO | 2019117594 | A1 | 6/2019 |
| WO | 2019202749 | A1 | 10/2019 |

OTHER PUBLICATIONS

European Search Report issued for European Patent Application No. 20900582.6 on Dec. 16, 2022, 7 pages.

European Search Report issued for European Patent Application No. 20899752.8 on Dec. 6, 2022, 7 pages.

European Search Report issued for European Patent Application No. 20900394.6 on Dec. 23, 2022, 8 pages.

Extended European Search Report for Application No. 20899077.0 dated Apr. 28, 2023, 8 pages.

International Search Report and Written Opinion issued for International Application No. PCT/KR2020/018041 on Apr. 2, 2021, 9 pages.

* cited by examiner

PRESSURE-SENSITIVE ADHESIVE LAYER

TECHNICAL FIELD

This application is a 37 U.S.C. 371 National Phase Entry Application from PCT/KR2020/018041 filed on Dec. 10, 2020, which claims priority based on Korean Patent Application No. 10-2019-0164158 filed on Dec. 10, 2019 and Korean Patent Application No. 10-2019-0167239 filed on Dec. 13, 2019, the disclosures of which are incorporated herein by reference in their entirety.

The present application relates to a pressure-sensitive adhesive layer.

BACKGROUND OF THE INVENTION

A flexible device is a new conceptual device, and an example thereof includes a so-called foldable device or rollable device. When the foldable device is folded or the rollable device is rolled, different types of force are applied thereto in the folding part or rolling part and other parts, and even in the folding part or rolling part, different types of force are applied thereto depending on the distance relationship with the folding axis or rolling axis.

When the device includes a pressure-sensitive adhesive layer, the force, which compresses the pressure-sensitive adhesive layer in the thickness direction and stretches it in the longitudinal direction, is applied thereto in the portion (100) overlapping with the folding axis or adjacent thereto within the folding part of the foldable device, but the force is applied thereto in the form that the pressure-sensitive adhesive layer is expanded in the thickness direction in the folding portion (200) far from the folding axis, as exemplarily shown in FIG. 1.

As above, the degree and shape of the force applied depending on the position in the folding or rolling part and other parts, and even in the folding or rolling part, are different, and thus when the pressure-sensitive adhesive layer with the same physical properties is applied regardless of the parts, defects of the pressure-sensitive adhesive layer occur in at least one part. The defects of the pressure-sensitive adhesive layer include lifting, peeling, cohesive failure and/or bubble generation of the pressure-sensitive adhesive layer, and the like.

In order to solve such a problem, a pressure-sensitive adhesive layer prepared to have different physical properties in a folding or rolling part and other parts is disclosed in Patent Document 1 or the like.

The method disclosed in Patent Document 1 is a method of irradiating with electromagnetic waves only a partial region of a pressure-sensitive adhesive layer in the form that is crosslinked by irradiation of electromagnetic waves, such as ultraviolet rays, to induce physical property differences in the region irradiated with electromagnetic waves and other regions.

However, it is not described in Patent Document 1 how the difference in physical properties between the region irradiated with electromagnetic waves and other regions in the pressure-sensitive adhesive layer should be specifically set to have an advantageous effect on the foldable or rollable device.

In addition, in the pressure-sensitive adhesive layer disclosed in Patent Document 1, it is difficult to greatly increase the difference in physical properties between regions having different physical properties.

That is, in the flexible device, it is advantageous that the pressure-sensitive adhesive applied to the folding or rolling part and the pressure-sensitive adhesive applied to the portion overlapping with the folding or rolling axis or adjacent thereto even in the folding or rolling part exhibit a relatively low elastic modulus and a high creep strain rate, but it is advantageous in terms of cuttability or workability that the pressure-sensitive adhesives applied to parts other than the folding or rolling part and to the outer part away from the folding or rolling axis even in the folding or rolling part exhibits a relatively high elastic modulus and a low creep strain rate.

The method disclosed in Patent Document 1 is a method of causing an irradiance level of electromagnetic waves in the same pressure-sensitive adhesive layer to induce a physical property difference. However, in such a method, it is possible to induce a physical property deviation over a certain level in the pressure-sensitive adhesive layer through the cross-linking density difference due to the irradiance level difference of electromagnetic waves, but there is a limit to greatly increase the deviation in the physical properties such as an elastic modulus or creep strain rate for the same material.

Furthermore, in Patent Document 1, there is interest in the difference in physical properties between the folding or rolling part and other parts, but it is not considered that different types of force are applied to different degrees depending on the portions even in the folding or rolling part.

Depending on the physical properties, it is advantageous in some cases to have a small difference in the physical properties between the pressure-sensitive adhesive applied to the folding or rolling part and the pressure-sensitive adhesive applied to other parts, and between the pressure-sensitive adhesive applied to the part overlapping with or adjacent to the folding or rolling axis even in the folding or rolling part and the pressure-sensitive adhesive applied to the outer part far from the folding or rolling axis. For example, it is advantageous that the elastic modulus and the creep strain rate have large differences, but it is advantageous to show as little difference as possible in a peel force or recovery rate.

However, the degree of difference in the peel force or recovery rate of the pressure-sensitive adhesive varies with the same tendency as the degree of difference in the elastic modulus or creep strain rate of the relevant pressure-sensitive adhesive, so that for the same pressure-sensitive adhesive, it is a very difficult problem that while the difference in the elastic modulus or creep strain rate is increased, the difference in the peel force or recovery rate is relatively decreased.

PRIOR ART DOCUMENT

Patent Document (Patent Document 1) Korean Laid-Open Patent Publication No. 10-2016-0047035

BRIEF SUMMARY OF THE INVENTION

The present application relates to a pressure-sensitive adhesive layer. In the present application, it is one object to provide a pressure-sensitive adhesive layer comprising at least first and second regions having different physical properties, wherein the difference in physical properties, such as an elastic modulus or creep strain rate, which are advantageous as the difference in physical properties between the regions increases, is maintained relatively large for each region, and the difference in physical properties, such as a peel force or recovery rate, which are advantageous as the difference in physical properties between the regions decreases, is maintained relatively small for each region.

In the present application, it is one object to provide a pressure-sensitive adhesive layer, wherein such first and second regions are formed of a pressure-sensitive adhesive having the same composition.

It is also an object of the present application to provide a pressure-sensitive adhesive for a flexible device such as a foldable device or a rollable device.

DETAILED DESCRIPTION OF THE INVENTION

Among the physical properties mentioned herein, when the measured temperature affects the relevant physical property, the physical property is a physical property measured at room temperature, unless otherwise specified.

In this specification, the term room temperature is a temperature in a state where it is not particularly heated and cooled, which may mean any one temperature within a range of about 10° C. to 30° C., for example, a temperature of about 27° C. or less with being about 15° C. or more, 18° C. or more, 20° C. or more, or about 23° C. or more. In addition, unless otherwise specified, the unit of temperature mentioned herein is° C.

Among the physical properties mentioned herein, when the measured pressure affects the relevant physical property, the physical property is a physical property measured at normal pressure, unless otherwise specified.

In this specification, the term normal pressure is a pressure in a state where it is not particularly pressurized and depressurized, which usually means, as the atmospheric pressure level, a pressure of about 1 atmosphere or so.

Among the physical properties mentioned herein, when the measured humidity affects the relevant physical property, the physical property is a physical property measured at natural humidity in the room temperature and normal pressure state, unless otherwise specified.

The present application relates to a pressure-sensitive adhesive layer. The pressure-sensitive adhesive layer of the present application may comprise at least first and second regions. The first and second regions are regions in which creep strain rate characteristics and/or storage elastic modulus characteristics are different from each other. If the creep strain and/or storage elastic modulus characteristics are different from each other, the first and second regions may also have the same other physical properties.

The first and second regions may be formed in a single pressure-sensitive adhesive layer (one-layer pressure-sensitive adhesive layer). Therefore, the first and second regions may form the surface of the same pressure-sensitive adhesive layer.

In one example, the first and second regions may be formed to have storage elastic modulus characteristics and/or creep strain rate characteristics different from each other in a state where the pressure-sensitive adhesive layers of the relevant regions have the same composition.

Here, the matter that the pressure-sensitive adhesive layers of the first and second regions have the same composition means that the pressure-sensitive adhesive layers of the first and second regions each comprise the same copolymer.

When the first and second regions each comprise a cross-linking agent, the cross-linking agent may be the same type.

Here, the matter that the copolymers are the same means that the copolymers comprise the same kind of monomer units in substantially the same content. Here, the substantially the same content means the case that the same monomer unit contents in both copolymers are completely the same, or even if there is a difference, the difference is within 10 weight %, within 9 weight %, within 8 weight %, within 7 weight %, within 6 weight %, within 5 weight %, within 4 weight %, within 3 weight %, within 2 weight %, or within 1 weight %. Even when the first and second regions having the same composition each comprise two or more copolymers, the kinds of two or more copolymers may be the same, and the ratios between them may be substantially the same. Here, the substantially the same content of two or more copolymers means the case that the ratios between the copolymers are completely the same, or even if there is a difference, the difference is within 10 weight %, within 9 weight %, within 8 weight %, within 7 weight %, within 6 weight %, within 5 weight %, within 4 weight %, within 3 weight %, within 2 weight %, or within 1 weight %.

In addition, when the same cross-linking agent is included in the first and second regions having the same composition, respectively, the contents may be the same or different, and when the contents are different, the difference between the content of the cross-linking agent included in the first region and the content of the cross-linking agent included in the second region may be within 10 weight %, within 9 weight %, within 8 weight %, within 7 weight %, within 6 weight %, within 5 weight %, within 4 weight %, within 3 weight %, within 2 weight % or within 1 weight %.

Furthermore, in this specification, the term copolymer means a resulting product of a polymerization reaction of a monomer mixture. In addition, the term monomer unit means a state where the monomers form a copolymer after the polymerization reaction.

The first and second regions of the pressure-sensitive adhesive layer may have different creep strain rate characteristics.

In a flexible device, the pressure-sensitive adhesive layer applied to the folding or rolling part receives more stress upon folding or rolling compared to the pressure-sensitive adhesive layer applied to other parts, and also has severe deformation. In addition, the pressure-sensitive adhesive in the part overlapping with or adjacent to the folding axis or rolling axis even in the folding or rolling part receives more stress compared to the pressure-sensitive adhesive in the outer part, and has severe deformation. Therefore, it is advantageous that the pressure-sensitive adhesive layer applied to the parts is formed to be capable of effectively coping with deformation and efficiently relieving stress.

For example, when the second region of the first and second regions is a pressure-sensitive adhesive layer applied to a folding or rolling part, or the second region is a pressure-sensitive adhesive layer overlapping with or present to be adjacent to a folding or rolling axis, it may be advantageous that the absolute value of the difference between the creep strain rates (60° C.) of the first and second regions is 20% or more. The difference in the creep strain rates may be determined according to Equation 1 below.

$$D_{C60}=100\times(C_{60.1}-C_{60.2})/C_{60.2} \quad \text{[Equation 1]}$$

In Equation 1, $D_{C60}$ is the difference in the creep strain rates, $C_{60.1}$ is the creep strain rate of the first region at 60° C., and $C_{60.2}$ is the creep strain rate of the second region at 60° C.

In another example, the absolute value of the difference in the creep strain rate may be 25% or more, 30% or more, 35% or more, 40% or more, 45% or more, 50% or more, 55% or more, 60% or more, 65% or more, 70% or more, 75% or more, or 80% or more, or may also be 100% or less, 95% or less, 90% or less, 85% or less, 80% or less, 75% or less, 70% or less, 65% or less, 60% or less, 55% or less, or 50% or less or so.

In one example, the difference in the creep strain rate may be a negative number.

The greater the creep strain rate, the more the stress can be relieved upon folding or rolling and the deformation can be effectively followed, but the cuttability and storage stability of the pressure-sensitive adhesive layer, and the like are deteriorated. Therefore, the greater the difference in the creep strain rate between the pressure-sensitive adhesive layer used in a part with severe deformation, such as a folding or rolling part or a part adjacent to a folding axis or rolling axis, and the pressure-sensitive adhesive layer applied to other parts, the more advantageous it is, but in the case of using the conventional pressure-sensitive adhesive layer, it is difficult to set such a large difference as above. However, in the present application, the difference can be effectively controlled.

In the pressure-sensitive adhesive layer of the present application, the creep strain rate of the first region can be effectively set to be large while the creep strain rate of the second region is maintained relatively high, and in one example, the creep strain rate of the second region at 60° C. may be 100% or more, 150% or more, 200% or more, 250% or more, 300% or more, 350% or more, 400% or more, 450% or more, or 500% or more or so. The upper limit of the creep strain rate of the second region at 60° C. is not particularly limited, but it may be, for example, 1,000% or less, 950% or less, 900% or less, 850% or less, 800% or less, 750% or less, 700% or less, 650% or less, 600% or less, 550% or less, 500% or less, 450% or less, or 400% or less or so. When the second region having such a range is applied to the folding or rolling part or is applied close to the folding axis or rolling axis, the deformation can also be followed well, while the stress applied upon folding or rolling can be effectively relieved, and as such a creep strain rate of the second region represents the difference from that of the first region, the pressure-sensitive adhesive layer, in which cuttability and storage stability, and the like are also secured, may be provided.

The absolute value of the difference in the creep strain rates (−20° C.) of the first and second regions of the pressure-sensitive adhesive layer may be 5% or more. The difference in the creep strain rates may be determined according to Equation 3 below.

$$D_{CM20}=100\times(C_{M20.1}-C_{M20.2})/C_{M20.2} \quad \text{[Equation 3]}$$

In Equation 3, $D_{CM20}$ is the difference in the creep strain rates, $C_{M20.1}$ is the creep strain rate of the first region at −20° C., and $C_{M20.2}$ is the creep strain rate of the second region at −20° C.

In another example, the absolute value of the difference in the creep strain rates may be 7% or more, 9% or more, 11% or more, 13% or more, 15% or more, 17% or more, 19% or more, 21% or more, 23% or more, 25% or more, 27% or more, or 29% or more, or may also be 100% or less, 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, or 15% or less or so.

In one example, the difference in the creep strain rates may be a negative number.

In one example, the creep strain rate of the second region at −20° C. may be 30% or more, 35% or more, 40% or more, 45% or more, 50% or more, 55% or more, 60% or more, 65% or more, 70% or more, 75% or more, 80% or more, 85% or more, 90% or more, 95% or more, 100% or more, 105% or more, 110% or more, or 115% or more or so. In another example, the creep strain rate at −20° C. may be 1,000% or less, 950% or less, 900% or less, 850% or less, 800% or less, 750% or less, 700% or less, 650% or less, 600% or less, 550% or less, 500% or less, 450% or less, 400% or less, 350% or less, 300% or less, 250% or less, 200% or less, 150% or less, 100% or less, 90% or less, 80% or less, or 70% or less or so.

Under the creep strain rate of the second region and the ratio of the creep strain rates of the first and second regions as above, it is possible to provide a pressure-sensitive adhesive layer which can also follow the deformation well while effectively relieving the stress applied upon folding or rolling, and also secures cuttability and storage stability, and the like.

By having the above characteristics, the pressure-sensitive adhesive layer can be effectively applied to the flexible device through low temperature to high temperature regions.

In another example, for a similar purpose, the first and second regions of the pressure-sensitive adhesive layer may have different storage elastic modulus properties.

For example, when the second region of the first and second regions is a region present in a folding or rolling part, or a pressure-sensitive adhesive layer overlapping with or present to be adjacent to a folding or rolling axis, it may be advantageous that the absolute value of the difference in the storage elastic moduli (60° C.) of the first and second regions is 10% or more. The difference in the storage elastic moduli may be determined according to Equation 5 below.

$$D_{M60}=100\times(M_{60.1}-M_{60.2})/M_{60.2} \quad \text{[Equation 5]}$$

In Equation 5, $D_{M60}$ is the difference in the storage elastic moduli, $M_{60.1}$ is the storage elastic modulus of the first region at 60° C., and $M_{60.2}$ is the storage elastic modulus of the second region at 60° C.

In another example, the absolute value of the difference in the storage elastic moduli may be 15% or more, 20% or more, 25% or more, 30% or more, 35% or more, 40% or more, or 45% or more, or may also be 100% or less, 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, or 15% or less or so.

In one example, the difference in the storage elastic moduli may be a positive number.

The smaller the storage elastic modulus, the more the stress can be relieved upon folding or rolling and the deformation can be effectively followed, but the cuttability and storage stability of the pressure-sensitive adhesive layer, and the like are deteriorated. Therefore, the greater the difference in storage elastic modulus between the pressure-sensitive adhesive applied to the folding or rolling part, or the pressure-sensitive adhesive layer applied to the part close to the folding axis or rolling axis even in the folding or rolling part and the pressure-sensitive adhesive layer applied to other parts, the more advantageous it is, but in the case of using the conventional pressure-sensitive adhesive layer, it is difficult to set such a large difference as above. However, in the present application, the difference can be effectively controlled.

In the pressure-sensitive adhesive layer of the present application, the storage elastic modulus of the first region can be effectively set to be large while the storage elastic modulus of the second region is maintained relatively low, and in one example, the storage elastic modulus of the second region at 60° C. may be 50,000 Pa or less, 45,000 Pa or less, 40,000 Pa or less, 35,000 Pa or less, 30,000 Pa or less, 25,000 Pa or less, 20,000 Pa or less, or 15,000 Pa or less, or may also be 1,000 Pa or more, 1500 Pa or more, 2,000 Pa or more, 2500 Pa or more, 3,000 Pa or more, 3500 Pa or more, 4,000 Pa or more, 4500 Pa or more, 5,000 Pa or more, 5500 Pa or more, 6,000 Pa or more, 6,500 Pa or more, 7,000 Pa or more, 7,500 Pa or more, 8,000 Pa or more, 8,500 Pa or more, 9,000 Pa or more, 9,500 Pa or more, 10,000 Pa or more, 11,000 Pa or more, 12,000 Pa or more, 13,000 Pa or more, 14,000 Pa or more, 15,000 Pa or more, or 16,000 Pa or more or so. When the second region having such a range is applied to a region that has more deformation upon folding or rolling, the deformation can also be followed well, while the stress applied upon folding or rolling can be effectively relieved, and as such a storage elastic modulus of the second region represents the difference from that of the first region, the pressure-sensitive adhesive layer, in which cuttability and storage stability, and the like are also secured, may be provided.

In the pressure-sensitive adhesive layer, the absolute value of the difference in the storage elastic moduli (30° C.) of the first and second regions may be 3% or more. The difference in the storage elastic moduli may be determined according to Equation 6 below.

$$D_{M30}=100\times(M_{30.1}-M_{30.2})/M_{30.2} \quad \text{[Equation 6]}$$

In Equation 6, $D_{M30}$ is the difference in the storage elastic moduli, $M_{30.1}$ is the storage elastic modulus of the first region at 30° C., and $M_{30.2}$ is the storage elastic modulus of the second region at 30° C.

In another example, the absolute value of the difference in the storage elastic moduli may be 5% or more, 7% or more, 9% or more, 11% or more, 13% or more, or 15% or more, or may also be 100% or less, 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, 15% or less, or 10% or less or so.

In one example, the difference in the storage elastic moduli may be a positive number.

In one example, the storage elastic modulus of the second region at 30° C. may be 50,000 Pa or less, 45,000 Pa or less, 40,000 Pa or less, 35,000 Pa or less, 30,000 Pa or less, or 25,000 Pa or less, or may also be 1,000 Pa or more, 1,500 Pa or more, 2,000 Pa or more, 2,500 Pa or more, 3,000 Pa or more, 3,500 Pa or more, 4,000 Pa or more, 4,500 Pa or more, 5,000 Pa or more, 5,500 Pa or more, 6,000 Pa or more, 6,500 Pa or more, 7,000 Pa or more, 7,500 Pa or more, 8,000 Pa or more, 8,500 Pa or more, 9,000 Pa or more, 9,500 Pa or more, 10,000 Pa or more, 11,000 Pa or more, 12,000 Pa or more, 13,000 Pa or more, 14,000 Pa or more, 15,000 Pa or more, 16,000 Pa or more, 17,000 Pa or more, 18,000 Pa or more, 19,000 Pa or more, 20,000 Pa or more, 21,000 Pa or more, 22,000 Pa or more, 23,000 Pa or more, or 24,000 Pa or more or so.

Under the storage elastic modulus of the second region and the ratio of the storage elastic moduli of the first and second regions as above, it is possible to provide a pressure-sensitive adhesive layer which can also follow the deformation well while effectively relieving the stress applied upon folding or rolling, and also secures cuttability and storage stability, and the like.

By having the above characteristics, the pressure-sensitive adhesive layer can be effectively applied to the flexible device through low temperature to high temperature regions.

In the pressure-sensitive adhesive layer, the absolute value of the difference in the storage elastic moduli (−20° C.) of the first and second regions may be 1% or more. The difference in the storage elastic moduli may be determined according to Equation 7 below.

$$D_{M20}=100\times(M_{20.1}-M_{20.2})/M_{20.2} \quad \text{[Equation 7]}$$

In Equation 7, $D_{M20}$ is the difference in the storage elastic moduli, $M_{20.1}$ is the storage elastic modulus of the first region at −20° C., and $M_{20.2}$ is the storage elastic modulus of the second region at −20° C.

In another example, the absolute value of the difference in the storage elastic moduli may be 3% or more, 5% or more, 7% or more, 9% or more, 11% or more, 13% or more, or 15% or more, or may also be 100% or less, 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, 15% or less, 10% or less, 8% or less, 6% or less, 4% or less, or 2% or less or so.

In one example, the difference in the storage elastic moduli may be a positive number or a negative number.

Also, in one example, the storage elastic modulus of the second region at −20° C. may be 500,000 Pa or less, 450,000 Pa or less, 400,000 Pa or less, 350,000 Pa or less, 300,000 Pa or less, 250,000 Pa or less, 200,000 Pa or less, 150,000 Pa or less, 140,000 Pa or less, 130,000 Pa or less, or 120,000 Pa or less, or may also be 10,000 Pa or more, 15,000 Pa or more, 20,000 Pa or more, 25,000 Pa or more, 30,000 Pa or more, 35,000 Pa or more, 40,000 Pa or more, 45,000 Pa or more, 50,000 Pa or more; 55,000 Pa or more, 60,000 Pa or more, 65,000 Pa or more, 70,000 Pa or more, 75,000 Pa or more, 80,000 Pa or more, 85,000 Pa or more, 90,000 Pa or more, 95,000 Pa or more, 100,000 Pa or more, 110,000 Pa or more, or 115,000 Pa or more or so.

Under the storage elastic modulus of the second region and the ratio of the storage elastic moduli of the first and second regions as above, it is possible to provide a pressure-sensitive adhesive layer which can also follow the deformation well while effectively relieving the stress applied upon folding or rolling, and also secures cuttability and storage stability, and the like.

In addition, by having the above characteristics, the pressure-sensitive adhesive layer can be effectively applied to the flexible device through low temperature to high temperature regions.

The first and second regions of the pressure-sensitive adhesive layer in the present application may satisfy any one of the creep strain rate characteristics and storage elastic modulus characteristics, or both.

Both of the first and second regions satisfying the creep strain rate characteristics and/or storage elastic modulus characteristics may be formed to have a recovery rate of a certain level or more. That is, as described above, the region (for example, the second region) of the pressure-sensitive adhesive layer applied to the folding or rolling part advantageously has a high creep strain and/or a low storage elastic modulus, but if the creep strain is too high or the storage elastic modulus is too low, the properties recovered after deformation (folding or rolling) are lowered. Therefore, for example, when the device is unfolded again after folding, there may be a problem that a folding mark or the like is observed in the folded portion. In this case, the second region needs to be set to have a high recovery rate, but the region having a high creep strain rate or a low storage elastic modulus tends to have a low recovery rate. However, in the present application, while the second region exhibits a relatively high creep strain rate and/or low storage elastic modulus as compared to the first region, it may be formed to exhibit a recovery rate of a certain level or more together with the first region.

Therefore, in one example, the first and second regions may have an absolute value of the difference in the recovery rates of 15% or less according to Equation 2 below.

$$D_{R60}=100\times(R_{60.1}-R_{60.2})/R_{60.2} \quad \text{[Equation 2]}$$

In Equation 2, $D_{R60}$ is the difference in the recovery rates, $R_{60.1}$ is the recovery rate of the first region at 60° C., and $R_{60.2}$ is the recovery rate of the second region at 60° C.

In another example, the absolute value of the difference in the recovery rates may be about 13% or less, 11% or less, 9% or less, 7% or less, 5% or less, or 3% or less or so, or may also be 0% or more, 0.5% or more, 1% or more, 1.5% or more, 2% or more, 2.5% or more, 3% or more, 3.5% or more, 4% or more, 4.5% or more, or 5% or more or so.

The difference in the recovery rates may be a positive number.

Also, in the pressure-sensitive adhesive layer, the recovery rate of the first region at 60° C. may be 80% or more, 85% or more, or 90% or more, or may also be 100% or less, 98% or less, 96% or less, 94% or less, 92% or less, or 90% or less or so.

In one example, the first and second regions may have an absolute value of the difference in the recovery rates of 20% or less according to Equation 4 below.

$$D_{RM20}=100\times(R_{M20.1}-R_{M20.2})/R_{M20.2} \quad \text{[Equation 4]}$$

In Equation 4, $D_{RM20}$ is the difference in the recovery rates, $R_{M20.1}$ is the recovery rate of the first region at −20° C., and $R_{M20.2}$ is the recovery rate of the second region at −20° C.

In another example, the absolute value of the difference in the recovery rates may be about 19% or less, about 17% or less, about 15% or less, about 13% or less, 11% or less, 9% or less, 7% or less, 5% or less, or 3% or less or so, or may also be 0% or more, 0.5% or more, 1% or more, 1.5% or more, 2% or more, 2.5% or more, 3% or more, 3.5% or more, 4% or more, 4.5% or more, 5% or more, 5.5% or more, 6% or more, 6.5% or more, 7% or more, 7.5% or more, 8% or more, 8.5% or more, or 9% or more or so.

The difference in the recovery rates may be a positive number.

Also, in the pressure-sensitive adhesive layer, the recovery rate of the first region at −20° C. may be 70% or more, 75% or more, 80% or more, 85% or more, or 90% or more, or may also be 100% or less, 98% or less, 96% or less, 94% or less, 92% or less, or 90% or less or so.

By forming the first and second regions as above, it is possible to provide a pressure-sensitive adhesive layer, wherein it is applied to a flexible device to effectively respond to repeated deformation (folding and/or rolling), there is no defect (for example, observation of deformation marks, etc.) before and after deformation, and the properties designed through low temperature to high temperature regions are stably maintained.

Both of the first and second regions satisfying the creep strain rate characteristics and/or storage elastic modulus characteristics may be formed to have peel force of a certain level or more. That is, as described above, the pressure-sensitive adhesive layer applied to a region other than the folding or rolling part advantageously has a low creep strain rate and/or a high storage elastic modulus, but if the creep strain rate is too low or the storage elastic modulus is too high, it is a general tendency that the peel force of the relevant region is lowered, and in this case, defects such as lifting, peeling, or bubble generation are likely to occur in the course of use. However, in the present application, the first region may be formed to exhibit a peel force of a certain level or more together with the second region, while exhibiting a relatively low creep strain rate and/or high storage elastic modulus as compared to the second region.

Therefore, in the pressure-sensitive adhesive layer satisfying the creep strain rate characteristics and/or storage elastic modulus characteristics, the first and second regions may have an absolute value of the difference in peel force of 40% or less according to Equation 8 below.

$$D_{PG}=100\times(P_{G,1}-P_{G,2})/P_{G,2} \quad \text{[Equation 8]}$$

In Equation 8, $D_{PG}$ is the difference in peel force, $P_{G,1}$ is the peel force of the first region to the glass, and $P_{G,2}$ is the peel force of the second region to the glass.

The peel force is the normal temperature peel force measured at room temperature.

In another example, the absolute value of the difference in peel force may be about 35% or less, 30% or less, 25% or less, 20% or less, 15% or less, 10% or less, or 5% or less, or may also be 0% or more, 5% or more, 10% or more, 15% or more, 20% or more, or 25% or more or so.

The difference in the peel force may be a negative number.

Also, in the pressure-sensitive adhesive layer, the room temperature peel force of the first region for the glass may be 500 gf/inch or more, 700 gf/inch or more, 900 gf/inch or more, 1000 gf/inch or more, or 1100 gf/inch or more, or may also be 3000 gf/inch or less, 2800 gf/inch or less, 2600 gf/inch or less, 2400 gf/inch or less, 2200 gf/inch or less, 2000 gf/inch or less, 1800 gf/inch or less, 1600 gf/inch or less, 1400 gf/inch or less, or 1200 gf/inch or less or so.

Furthermore, in one example, in the pressure-sensitive adhesive layer satisfying the creep strain rate characteristics and/or storage elastic modulus characteristics, the first and second regions may have an absolute value of the difference in peel force of 50% or less according to Equation 9 below.

$$D_{PI}=100\times(P_{I,1}-P_{I,2})/P_{I,2} \quad \text{[Equation 9]}$$

In Equation 9, $D_{PI}$ is the difference in peel force, $P_{I,1}$ is the peel force of the first region to the polyimide film, and $P_{I,2}$ is the peel force of the second region to the polyimide film.

The peel force is the normal temperature peel force measured at room temperature.

In another example, the absolute value of the difference in peel force may be about 45% or less, about 40% or less, 35% or less, 30% or less, 25% or less, 20% or less, 15% or less, or 10% or less or so, or may also be 0% or more, 5% or more, 10% or more, 15% or more, or 20% or more or so.

The difference in the peel force may be a negative number.

Also, in the pressure-sensitive adhesive layer, the room temperature peel force of the first region to the polyimide film may be 500 gf/inch or more, 700 gf/inch or more, 900 gf/inch or more, or 1000 gf/inch or more, or may also be 3000 gf/inch or less, 2800 gf/inch or less, 2600 gf/inch or less, 2400 gf/inch or less, 2200 gf/inch or less, 2000 gf/inch or less, 1800 gf/inch or less, 1600 gf/inch or less, 1400 gf/inch or less, 1200 gf/inch or less, or 1000 gf/inch or less or so.

By forming the first and second regions as above, it is possible to provide a pressure-sensitive adhesive layer, wherein it is applied to a flexible device to effectively respond to repeated deformation (folding and/or rolling), there is no defect (for example, observation of deformation marks, etc.) before and after deformation, and lifting, peeling, and/or bubble generation, and the like do not occur.

The pressure-sensitive adhesive layer of the present application may be formed in various forms as long as it comprises at least one of the first region and at least one of the second region.

One or two or more of the first and second regions may be formed, respectively. In addition, a third region having different storage elastic modulus and/or creep strain rate characteristics from those of the first and second regions may also be formed in the pressure-sensitive adhesive layer.

In one example, the number of regions having different storage elastic moduli and/or creep strain rates in the pressure-sensitive adhesive layer may be in the range of 2 to 50. Here, when the number of regions having different storage elastic moduli and/or creep strain rates is two, the pressure-sensitive adhesive layer comprises one of the first region and one of the second region, respectively. In another example, the number of regions having different storage elastic moduli and/or creep strain rates may be 3 or more, 4 or more, 5 or more, 6 or more, 7 or more, 8 or more, 9 or more, 10 or more, 11 or more, or 12 or more, or may also be 49 or less, 48 or less, 47 or less, 45 or less, 40 or less, 35 or less, 30 or less, or 25 or less or so. However, the above content corresponds to exemplary matters of the present application. The number of regions having different storage elastic moduli and/or creep strain rates may be changed according to the specific shape of the flexible device.

The formation form of regions having different storage elastic moduli and/or creep strain rates including the first and second regions in the pressure-sensitive adhesive layer may also be changed according to specific application uses, which is not particularly limited.

For example, the first and second regions of the pressure-sensitive adhesive layer may be formed in a direction parallel to the folding or rolling axis (3000) as shown in FIG. 2 or 3. At this time, the folding or rolling axis may be included in the second region among the first and second regions. FIG. 2 is an example of a case where one second region is formed in parallel with a folding or rolling axis, and FIG. 3 is an example of a case where two second regions are formed in parallel with a folding or rolling axis. Of course, two or more second regions may also be formed.

In addition, the second region may be formed horizontally with the folding or rolling axis, and may also be formed to form an angle of a certain range. For example, while the second region is formed in a linear shape and simultaneously forms an angle of greater than about 0 degrees to about 180 degrees or less with the folding or rolling axis, it may also be formed.

Furthermore, the first and second regions may be provided so that any one (the second region in the case of FIG. 4) of the first and second regions forms figures (2000) as exemplarily shown in FIG. 4. The case where the second region forms figures (2000) is exemplified in FIG. 4, but the figures (2000) may also be formed by the first region. The shape of the figure is also not limited, which may be formed in various shapes such as a circle, an ellipse, a triangle, a square, and/or other polygons.

The formation form of regions having different storage elastic moduli and/or creep strain rates including the first and second regions in the pressure-sensitive adhesive layer is not limited to the exemplary case, which may be variously changed.

Meanwhile, FIGS. 2 to 4 are examples of cases where the surface of the pressure-sensitive adhesive layer including the first and second regions is observed.

In one example, regions having different storage elastic moduli and/or creep strain rates including the first and second regions may be formed inside the pressure-sensitive adhesive layer. For example, as shown in FIG. 5, when the pressure-sensitive adhesive layer has been viewed from the side, the first region (1000) and the second region (2000) may be formed along the thickness direction of the pressure-sensitive adhesive layer. In FIG. 5, Reference Numeral 4000 denotes a base film to be described below.

When a base film to be described below is present on one or both sides of the pressure-sensitive adhesive layer, as exemplarily shown in FIG. 5, the regions having different storage elastic moduli and/or creep strain rates including the first region (1000) and the second region (2000) may be formed to be in contact with at least the base film (4000). By forming the regions in this way, the stress generated in the base material upon deformation (folding or rolling, etc.) can be effectively relieved, and the pressure-sensitive adhesive layer can be attached according to the curvature of the adherend, thereby improving the step embedding characteristics.

The pressure-sensitive adhesive layer may be formed in various ways including known methods. As the pressure-sensitive adhesive layer of the present application, which will be described below, is applied in this process, the first and second regions may be formed, in which the recovery rate and/or peel force is formed with a small difference over a certain level, while the difference in creep strain rate characteristics and/or storage elastic modulus characteristics between the above-mentioned regions is largely maintained.

For example, the first and second regions may be formed through a method of making a difference in the amount of heat applied to and/or electromagnetic waves irradiated to the pressure-sensitive adhesive layer to cause a difference in cross-linking densities between regions. Here, in the range of the electromagnetic waves, microwaves, infrared rays (IR), ultraviolet rays (UV), X-rays and gamma rays, as well as particle beam such as alpha-particle beam, proton beam, neutron beam or electron beam may be included, and typically it may be ultraviolet rays or electron beam.

By such a method, a region formed with a high cross-linking density usually becomes the first region, and a region formed with a relatively low cross-linking density becomes the second region.

Here, the method of causing a difference in cross-linking densities by irradiation of electromagnetic waves is not particularly limited.

For example, the cross-linking density can be adjusted by controlling an irradiance level and/or irradiation time of electromagnetic waves in each location of the pressure-sensitive adhesive layer according to the desired pattern of the first and second regions. For example, when the irradiance level of electromagnetic waves in the pressure-sensitive adhesive layer is large or the irradiation time is long, the cross-linking density of the pressure-sensitive adhesive increases to form a first region, and conversely, when the irradiance level of electromagnetic waves is small or the irradiation time is short, the second region can be formed. Also, the second region may be formed even when the irradiance level of ultraviolet rays is zero.

The method of controlling the cross-linking density by differentiating the irradiation of electromagnetic waves as above is not particularly limited. For example, the difference in electromagnetic wave irradiation may be induced by a method of spot-irradiating it with electromagnetic waves using a laser processing apparatus or a stepper (exposure apparatus); a method of using a blocking or light-shielding mask against electromagnetic waves, and the like.

The method by spot irradiation is a method of inducing a deviation of a cross-linking density by moving the pressure-sensitive adhesive layer or by moving the spot-irradiated electromagnetic wave itself on the plane of the pressure-sensitive adhesive layer, while spot irradiation with electromagnetic waves. In this process, the deviation of the cross-linking density may be induced by controlling the diameter of the spot-irradiated electromagnetic waves, the movement path of the irradiation light source, the irradiance level or the irradiation time.

Meanwhile, when the first and second regions are implemented using a blocking mask, electromagnetic waves may be irradiated to the pressure-sensitive adhesive layer via the blocking mask.

FIG. 6 is a schematic diagram showing a method of forming first and second regions of one exemplary pressure-sensitive adhesive layer, which is a diagram showing a process of laminating, on a pressure-sensitive adhesive layer (b) formed on a base film (a), a transparent release film (c), and then irradiating it with electromagnetic waves via a blocking mask (d). In the drawing, the electromagnetic waves are indicated by arrows. In the drawing, the case of additionally irradiating it weak electromagnetic waves after removal of the blocking mask (d) is shown, but the subsequent process may not be performed.

Here, the blocking mask may be made of a material that blocks the irradiated electromagnetic waves and may not transmit them. The material constituting the mask is not particularly limited, and for example, a general material known in this field may be appropriately employed and used.

The first and second regions, and the like may also be formed using a light-shielding mask. In this case, the pressure-sensitive adhesive layer is irradiated with electromagnetic waves via the light-shielding mask.

FIG. 7 is a diagram showing a process of forming, on a pressure-sensitive adhesive layer (b) formed on a base film (a), a transparent release film (c), and then irradiating it with electromagnetic waves via a light-shielding mask (e). The irradiated electromagnetic waves are indicated by arrows.

Here, the light-shielding mask means a mask made of a material having a light-shielding rate in a range of about 40% to 95% or 50% to 90% with respect to the irradiated electromagnetic waves. The material constituting the mask is not particularly limited, and a general material known in this field may be appropriately employed and used. When a predetermined pattern is formed on such a light-shielding mask and electromagnetic waves are irradiated via the pattern, as shown in FIG. 7, even under the same irradiation conditions, the portion where the pattern is formed transmits electromagnetic waves to be irradiated with strong electromagnetic waves, and the portion where the pattern is not formed transmits only a part of the irradiated electromagnetic waves to be irradiated with weak electromagnetic waves. Accordingly, the region irradiated with the strong electromagnetic waves and the region irradiated with the weak electromagnetic waves may be formed as first and second regions, respectively.

In another example, the first and second regions may also be formed using a transparent film (e.g., a release film, etc.) having a printed pattern formed thereon. That is, the first and second regions may be formed by printing a pattern on a release film with ink having a property of absorbing the electromagnetic waves to be irradiated and then irradiating the pressure-sensitive adhesive layer with the electromagnetic waves via the relevant printed pattern. FIG. 8 is a schematic diagram of the case where in a structure that a base film (a), a pressure-sensitive adhesive layer (b) and a release film (c) are sequentially formed, print patterns (c1, c2, c3, c4, c5, c6, c7) are formed on the release film (c) and electromagnetic waves (arrows) are irradiated. In this method, by setting each transmittance of the printed patterns (c1, c2, c3, c4, c5, c6, c7) differently, it is possible to implement the pressure-sensitive adhesive layer in which the first and second regions are formed more finely.

In the present application, in addition to the above method, various methods are applied to induce a difference in cross-linking density, and as a result, the first and second regions may be formed.

On the other hand, there is no particular limitation on the quantity of electromagnetic waves irradiated in the above process. The shape of the electromagnetic waves may also be selected so that appropriate first and second regions may be formed, and for example, the electromagnetic waves may be irradiated with a light quantity within a range of about 1,000 $mJ/cm^2$ to 5,000 $mJ/cm^2$. At this time, there is no particular limitation on the wavelength of the irradiated electromagnetic waves, and the electromagnetic waves having a wavelength capable of cross-linking the pressure-sensitive adhesive layer may be irradiated. In one example, the electromagnetic waves may be irradiated through a light source of Fusion D-bulb equipment.

The pressure-sensitive adhesive layer of the present application may comprise an acrylic copolymer. The term acrylic copolymer means a copolymer comprising 50 weight % or more, 55 weight % or more, 60 weight % or more, 65 weight % or more, 70 weight % or more, 75 weight % or more, 80 weight % or more, 85 weight % or more, or 90 weight % or more of an acrylic monomer unit in total monomer units. The ratio of the acrylic monomer unit in the copolymer may also be 100 weight % or less, 99 weight % or less, 98 weight % or less, 97 weight % or less, 96 weight % or less, or 95 weight % or less or so.

Here, the acrylic monomer means acrylic acid, methacrylic acid or a derivative thereof (e.g., acrylic acid ester or methacrylic acid ester).

The pressure-sensitive adhesive layer may comprise the acrylic copolymer in a weight ratio of 50 weight % or more, 55 weight % or more, 60 weight % or more, 65 weight % or more, 70 weight % or more, 75 weight % or more, 80 weight % or more, 85 weight % or more, or 90 weight % or more. The content ratio of the acrylic copolymer in the pressure-sensitive adhesive layer may also be about 100 weight % or less, 99 weight % or less, 98 weight % or less, 97 weight % or less, 96 weight % or less, or 95 weight % or less or so.

As the acrylic copolymer, an acrylic copolymer comprising an alkyl (meth) acrylate unit, a unit of the following formula 1, a polar functional group-containing unit and a unit of the following formula 2 may be used.

Here, the unit means a monomer unit.

[Formula 1]

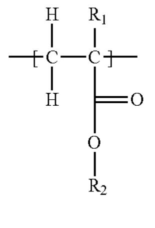

In Formula 1, $R_1$ represents hydrogen or an alkyl group, and $R_2$ represents an alkyl group having 11 to 13 carbon atoms.

[Formula 2]

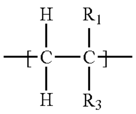

In Formula 2, $R_1$ represents hydrogen or an alkyl group, and $R_3$ represents an aromatic ketone group or a (meth) acryloyl group.

The acrylic copolymer comprising such monomer units is effective in forming the desired first and second regions.

In particular, the acrylic copolymer is formed as a so-called crystalline copolymer under a predetermined ratio of the unit of Formula 1 and/or the polar functional group-containing unit, or has properties similar to those of the crystalline copolymer. In this specification, the term crystalline copolymer means a copolymer whose melting point is confirmed in a predetermined range in the DSC (differential scanning calorimeter) measurement method described in Examples of this specification.

Generally, the acrylic copolymer is known as an amorphous copolymer. However, when the unit of Formula 1 is present in a predetermined ratio, and in some cases, when the unit of Formula 1 interacts with the polar functional group present in a predetermined ratio, such a copolymer may exhibit crystallinity, or may exhibit at least properties similar to crystallinity. When such a copolymer having crystallinity or properties similar to crystallinity is applied, the pressure-sensitive adhesive layer having the first and second regions with the above-described properties can be efficiently formed. Therefore, the pressure-sensitive adhesive layer including the first and second regions as described above can be effectively formed through the pressure-sensitive adhesive layer, to which such a copolymer is applied.

As the alkyl (meth) acrylate unit contained in the copolymer, for example, a unit derived from an alkyl (meth) acrylate having an alkyl group having 1 to 10 carbon atoms can be used. In another example, the alkyl group may be an alkyl group having 2 to 20 carbon atoms, 3 to 10 carbon atoms, 4 to 10 carbon atoms, 4 to 10 carbon atoms, 4 to 9 carbon atoms, or 4 to 8 carbon atoms. The alkyl group may be linear or branched, and may be substituted or unsubstituted. In one example, as the alkyl group, the unit may be formed using an alkyl (meth) acrylate having a linear or branched, unsubstituted alkyl group.

An example of the alkyl (meth) acrylate can be exemplified by methyl (meth) acrylate, ethyl (meth) acrylate, n-propyl (meth) acrylate, isopropyl (meth) acrylate, n-butyl (meth) acrylate, t-butyl (meth) acrylate, sec-butyl (meth) acrylate, pentyl (meth) acrylate, 2-ethylhexyl (meth) acrylate, 2-ethylbutyl (meth) acrylate, isononyl (meth) acrylate, n-octyl (meth) acrylate or isooctyl (meth) acrylate, and the like, but is not limited thereto.

The acrylic copolymer may comprise the alkyl (meth) acrylate unit in a ratio within the range of about 10 to 80 weight %. In another example, the ratio of the alkyl (meth) acrylate unit is 15 weight % or more, 20 weight % or more, 25 weight % or more, 30 weight % or more, 35 weight % or more, 40 weight % or more, or 45 weight % or more, or may also be 75 weight % or less, 70 weight % or less, 65 weight % or less, 60 weight % or less, 55 weight % or less, 50 weight % or less, or 45 weight % or less or so. Within this range, a desired pressure-sensitive adhesive layer can be effectively formed.

The polar functional group-containing unit is a unit formed of a monomer having a polar functional group. Such a monomer usually contains a polymerizable group (e.g., a carbon-carbon double bond) and a polar functional group at the same time.

The monomer having a polar functional group may include a hydroxy group-containing monomer, a carboxyl group-containing monomer and a nitrogen-containing monomer, and the like, and in the present application, it is particularly advantageous to apply a hydroxy group-containing monomer, without being limited thereto.

The hydroxy group-containing monomer may include 2-hydroxyethyl (meth) acrylate, 2-hydroxypropyl (meth) acrylate, 4-hydroxybutyl (meth) acrylate, 6-hydroxyhexyl (meth) acrylate, 8-hydroxyoctyl (meth) acrylate, 2-hydroxy polyethylene glycol (meth) acrylate or 2-hydroxy polypropylene glycol (meth) acrylate, and the like, an example of the carboxyl group-containing monomer may include (meth) acrylic acid, 2-(meth) acryloyloxy acetic acid, 3-(meth) acryloyloxy propyl acid, 4-(meth) acryloyloxy butyric acid, an acrylic acid dimer, itaconic acid, maleic acid and maleic acid anhydride, and the like, and an example of the nitrogen-containing monomer may include (meth) acrylamide, N-vinyl pyrrolidone or N-vinyl caprolactam, and the like, without being limited thereto. One or a mixture of two or more of the foregoing may be used.

The polar functional group-containing unit may be included in the acrylic copolymer in a ratio of approximately 5 to 100 parts by weight relative to 100 parts by weight of the alkyl (meth) acrylate unit, and under such a ratio, the durability, tackiness and peel force of the pressure-sensitive adhesive layer may be stably maintained. In another example, the polar functional group-containing unit may be included in 10 parts by weight or more, 15 parts by weight or more, 20 parts by weight or more, 25 parts by weight or more, 30 parts by weight or more, 35 parts by weight or more, 40 parts by weight or more, or 45 parts by weight or more relative to 100 parts by weight of the alkyl (meth) acrylate unit, or may also be included in 95 parts by weight or less, 90 parts by weight or less, 85 parts by weight or less, 80 parts by weight or less, 75 parts by weight or less, 70 parts by weight or less, 65 parts by weight or less, 60 parts by weight or less, 55 parts by weight or less, 50 parts by weight or less, 45 parts by weight or less, 40 parts by weight or less, 35 parts by weight or less, 30 parts by weight or less, or 25 parts by weight or less.

The unit of Formula 1 above is a unit containing a long-chain alkyl group, and such a unit is included in the copolymer at a certain ratio or more, and imparts crystallinity or crystallinity-like properties to the copolymer by interacting with the polar functional group as necessary.

In the unit of Formula 1, $R_1$ may be hydrogen or an alkyl group having 1 to 4 carbon atoms, and specifically hydrogen, methyl or ethyl group.

In Formula 1, $R_2$ is an alkyl group having 11 to 13 carbon atoms, and such an alkyl group may be linear or branched, and may be substituted or unsubstituted. In one example, $R_2$ may be a linear, unsubstituted alkyl group. For example, the unit of Formula 1 may be formed using lauryl (meth) acrylate and/or tetradecyl (meth) acrylate, and the like.

The unit of Formula 1 may be included in the acrylic copolymer in a ratio of approximately 50 to 300 parts by weight relative to 100 parts by weight of the alkyl (meth)

acrylate unit. In another example, the ratio of the unit of Formula 1 may be about 55 parts by weight or more, 60 parts by weight or more, 65 parts by weight or more, 70 parts by weight or more, 75 parts by weight or more, 80 parts by weight or more, 85 parts by weight or more, 90 parts by weight or more, or 95 parts by weight or more, or may also be 280 parts by weight or less, 260 parts by weight or less, 240 parts by weight or less, 220 parts by weight or less, 200 parts by weight or less, 180 parts by weight or less, 160 parts by weight or less, 140 parts by weight or less, 120 parts by weight or less, 100 parts by weight or less, or 90 parts by weight or less or so, relative to 100 parts by weight of the alkyl (meth) acrylate unit.

The unit of Formula 2 in the acrylic copolymer is a unit containing an aromatic ketone group or a (meth) acryloyl group in a side chain.

In the pressure-sensitive adhesive layer, the aromatic ketone group or (meth) acryloyl group may exist in its state, or may also exist in a state after undergoing a hydrogen removal reaction or a radical reaction, which is described below.

The aromatic ketone group in the unit of Formula 2 means an aromatic ketone group that induces hydrogen abstraction from a polymer chain when exposed to electromagnetic waves, or a substituent containing such an aromatic ketone group.

When the pressure-sensitive adhesive layer is exposed to electromagnetic waves, the aromatic ketone groups can remove hydrogen atoms from other polymer chains or from other parts of the polymer chains. This removal results in the formation of radicals, and the radicals can form crosslinks between polymer chains or within the same polymer chain. In the category of such aromatic ketone groups, for example, aromatic ketone groups such as derivatives of benzophenone, acetophenone or anthraquinone are included.

The monomer capable of deriving the unit of Formula 2 having such an aromatic ketone group includes 4-benzoylphenyl (meth) acrylate, 4-(meth) acryloyloxyethoxybenzophenone, 4-(meth) acryloyloxy-4'-methoxybenzophenone, 4-(meth) acryloyloxyethoxy-4'-methoxybenzophenone, 4-(meth) acryloyloxy-4'-bromobenzophenone and/or 4-acryloyloxyethoxy-4'-bromobenzophenone, and the like, but is not limited thereto.

Meanwhile, the (meth) acryloyl group in the unit of Formula 2 above means a (meth) acryloyl group that induces free radical polymerization when exposed to electromagnetic waves in the presence of an appropriate radical initiator, or a substituent containing the same. Such a (meth) acryloyl group may act similarly to the aromatic ketone group by irradiation with electromagnetic waves.

The unit of Formula 2, wherein $R^3$ is a (meth) acryloyl group, may be formed, for example, by preparing a precursor copolymer and subsequently further reacting with an unsaturated reagent compound to introduce a (meth) acryloyl group. Typically, the introduction of the (meth) acryloyl group involves (1) a reaction between a nucleophilic group on the precursor copolymer and an electrophilic group on the unsaturated reagent compound (that is, the unsaturated reagent compound comprises both an electrophilic group and a (meth) acryloyl group)), or (2) a reaction between an electrophilic group on the precursor copolymer and a nucleophilic group on the unsaturated reagent compound (that is, the unsaturated reagent compound comprises both a nucleophilic group and a (meth) acryloyl group). These reactions between nucleophilic groups and electrophilic groups are typically ring opening reactions, addition reactions or condensation reactions.

In this case, the precursor copolymer has a hydroxy, carboxylic acid (—COOH), or anhydride (—O—(CO)—O—) group. When the precursor copolymer has a hydroxy group, the unsaturated reagent compound often has a carboxylic acid (—COOH), isocyanato (—NCO), epoxy (i.e., oxiranyl) or anhydride group in addition to a (meth) acryloyl group. When the precursor copolymer has a carboxylic acid group, the unsaturated reagent compound often has a hydroxy, amino, epoxy, isocyanato, aziridinyl, azetidinyl or oxazolinyl group in addition to a (meth) acryloyl group. When the precursor (meth) acrylate copolymer has an anhydride group, the unsaturated reagent compound often has a hydroxy or amine group in addition to a (meth) acryloyl group.

In one example, the precursor copolymer may have a carboxylic acid group and the unsaturated reagent compound may have an epoxy group. An exemplary unsaturated reagent compound includes, for example, glycidyl (meth) acrylate and 4-hydroxybutyl acrylate glycidyl ether. In another example, the precursor copolymer has an anhydride group, which reacts an unsaturated reagent compound such as a hydroxy-substituted alkyl (meth) acrylate, for example, 2-hydroxyethyl (meth) acrylate, 3-hydroxypropyl (meth) acrylate, and the like. In another example, the precursor copolymer has a hydroxy group and the unsaturated reagent compound has an isocyanato group and a (meth) acryloyl group. Such an unsaturated reagent compound includes isocyanatoalkyl (meth) acrylate, for example, isocyanatoethyl (meth) acrylate, but is not limited thereto.

In one example, the (meth) acryloyl group may be represented by the formula $CH_2{=}CHR^1$—(CO)-Q-L-(wherein L is a linking group and Q is oxy (—O—) or —NH—). Here, L comprises alkylene, arylene or a combination thereof, and optionally, further comprises —O—, —O—(CO)—, —NH—(CO)—, —NH—, or a combination thereof, depending on the precursor copolymer and the specific unsaturated reagent compound, which are reacted to form a (meth) acryloyl group. In some specific examples, the (meth) acryloyl group is $H_2C{=}CHR^1$—(CO)—O—$R_6$—NH—(CO)—O—$R_5$—O—(CO)— formed by a reaction of a hydroxy-containing group represented by the formula-(CO)—O—$R_5$—OH in the precursor copolymer and the unsaturated reagent compound, which is an isocyanatoralkyl (meth) acrylate, represented by the formula $H_2C{=}CHR^1$—(CO)—O—$R_6$—NCO. Here, $R_5$ and $R_6$ are each independently an alkylene group, for example, alkylene having 1 to 10 carbon atoms, 1 to 6 carbon atoms, or 1 to 4 carbon atoms. In addition, here, $R_1$ is methyl or hydrogen.

Meanwhile, in the unit of Formula 2, $R_1$ may be hydrogen or an alkyl group having 1 to 4 carbon atoms, and specifically, may be hydrogen, methyl or an ethyl group.

The unit of Formula 2 may be included in the acrylic copolymer in a ratio of approximately 0.001 to 5 parts by weight relative to 100 parts by weight of the alkyl (meth) acrylate unit, and under such a ratio, the desired first and second regions may be effectively formed by irradiation of electromagnetic waves.

In another example, the ratio of the unit of Formula 2 above may be approximately 0.003 parts by weight or more, 0.005 parts by weight or more, 0.007 parts by weight or more, 0.009 parts by weight or more, 0.01 parts by weight or more, 0.015 parts by weight or more, 0.02 parts by weight or more, 0.025 parts by weight or more, 0.03 parts by weight or more, 0.035 parts by weight or more, 0.04 parts by weight or more, 0.045 parts by weight or more, 0.05 parts by weight or more, 0.055 parts by weight or more, 0.06 parts by weight or more, 0.065 parts by weight or more, 0.07 parts by weight or more, 0.075 parts by weight or more, 0.08 parts by weight or more, 0.085 parts by weight or more, 0.09 parts by weight or more, or 0.1 parts by weight or more, or may also be 4.5 parts by weight or less, 4 parts by weight or less, 3.5 parts by weight or less, 3 parts by weight or less, 2.5 parts by weight or less, 2 parts by weight or less, 2 parts by weight or less, 1.5 parts by weight or less, 1 part by weight or less, 0.5 parts by weight or less, 0.3 parts by weight or less, 0.1 parts by weight or less, 0.08 parts by weight or less; The amount may be about 0.06 parts by weight or less, 0.04 parts by weight or less, or 0.02 parts by weight or less or so, and under such a ratio, the desired first and second regions may be effectively formed by irradiation of electromagnetic waves.

The acrylic copolymer may appropriately comprise other monomer units in addition to the above-described monomer units, as long as the purpose is not impaired (for example, as long as the crystallinity of the copolymer is not impaired).

In one example, the acrylic copolymer included in the pressure-sensitive adhesive layer may be a crystalline acrylic copolymer. As described above, the term crystalline copolymer means a copolymer whose melting point is confirmed in a predetermined range in the DSC (differential scanning calorimeter) measurement method described in Examples of this specification.

In one example, as the acrylic copolymer, a crystalline acrylic copolymer having a melting point of approximately −20° C. or less or so, which is confirmed in the above manner, may be used. In another example, the melting point of the crystalline acrylic copolymer may be about −25° C. or less, −30° C. or less, −35° C. or less, or −40° C. or less, or may also be −100° C. or more, −95° C. or more, −90° C. or more, −85° C. or more, −80° C. or more, −75° C. or more, −70° C. or more, −65° C. or more, −60° C. or more, −55° C. or more, −50° C. or more, or −45° C. or more or so. The acrylic copolymer having such a melting point may form a pressure-sensitive adhesive layer having an appropriate storage elastic modulus, creep strain rate, peel force and recovery rate before and after irradiation of electromagnetic waves depending on the purpose.

The specific composition of the crystalline acrylic copolymer is not particularly limited. In one example, the crystalline acrylic copolymer may be a copolymer comprising at least four types of units as described above. However, all of the above-described acrylic copolymers do not exhibit crystallinity. In order for the acrylic copolymer to exhibit crystallinity, it is necessary to comprise at least 70 parts by weight or more of the unit of Formula 1 of the above-described units relative to 100 parts by weight of the alkyl (meth) acrylate unit. In another example, the ratio of the unit of Formula 1 in the crystalline acrylic copolymer may be 75 parts by weight or more, 80 parts by weight or more, 85 parts by weight or more, 90 parts by weight or more, 95 parts by weight or more, or 100 parts by weight or more, or may also be 2000 parts by weight or less, 1500 parts by weight or less, 1000 parts by weight or less, 900 parts by weight or less, 800 parts by weight or less, 700 parts by weight or less, 650 parts by weight or less, 600 parts by weight or less, 550 parts by weight or less, 500 parts by weight or less, 450 parts by weight or less, 400 parts by weight or less, 350 parts by weight or less, 300 parts by weight or less, 250 parts by weight or less, 200 parts by weight or less, or 150 parts by weight or less or so, relative to 100 parts by weight of the alkyl (meth) acrylate unit.

Also, in the crystalline acrylic copolymer, the ratio (A/B) of the weight (A) of the unit of Formula 1 to the weight (B) of the polar functional group-containing unit may be greater than 1.5. In another example, the ratio (A/B) may be 1.7 or more, 1.9 or more, 2.1 or more, 2.3 or more, 2.5 or more, 2.7 or more, 2.9 or more, 3.1 or more, 3.3 or more, 3.5 or more, 3.7 or more, or 3.9 or more, or may also be 10 or less, 9 or less, 8 or less, 7 or less, 6 or less, 5 or less, 4 or less, 3 or less, 2.5 or less, or 2 or less or so. Furthermore, in the crystalline acrylic copolymer, the polar functional group-containing unit may be a hydroxy group-containing unit.

In addition, in the crystalline acrylic copolymer, the alkyl (meth) acrylate unit may be included in a ratio within the range of about 20 to 70 weight %. In another example, the ratio of the alkyl (meth) acrylate unit may be 25 weight % or more, 30 weight % or more, 35 weight % or more, 40 weight % or more, or 45 weight % or more, or may also be 65 weight % or less, 60 weight % or less, 55 weight % or less, 50 weight % or less, or 45 weight % or less or so. Within this range, the desired pressure-sensitive adhesive layer may be effectively formed.

Although the reason is not clear, it is thought that crystallinity is provided to an acrylic copolymer by the interaction or regularity of each monomer unit contained in the ratio, and the melting point is confirmed.

As the acrylic copolymer, a copolymer having a weight average molecular weight of 1,000,000 or more may be used. In this specification, the weight average molecular weight means a polystyrene conversion value measured by GPC (gel permeation chromatography).

In one example, the weight average molecular weight of the copolymer may be 1,100,000 or more, 1,200,000 or more, 1,300,000 or more, 1,400,000 or more, 1,500,000 or more, 1,600,000 or more, 1,700,000 or more, 1,800,000 or more, 1,900,000 or more, or 2,000,000 or more, or may also be about 5,000,000 or less, 4,000,000 or less, 3,000,000 or less, 2,500,000 or less, or 2,000,000 or less or so.

In general, the lower the weight average molecular weight of the copolymer is set, the greater the change in physical properties (storage elastic modulus and/or creep strain rate) due to electromagnetic wave irradiation, so that in order to implement a large difference in physical properties between the first and second regions, it is advantageous to use a copolymer having as low a weight average molecular weight as possible. However, if the weight average molecular weight of the copolymer is low, it is disadvantageous in terms of durability under high temperature and/or high humidity conditions. However, in the case of the present application, by using the above-described specific copolymer, the first and second regions can be effectively implemented even in a state where the weight average molecular weight is maintained at an appropriate level.

The pressure-sensitive adhesive layer may further comprise a cross-linking agent. The cross-linking agent may react with the acrylic copolymer to implement a crosslinked structure.

The type of the cross-linking agent is not particularly limited, and for example, a general cross-linking agent such as an isocyanate-based compound, an epoxy-based compound, an aziridine-based compound and a metal chelate-based compound may be used. This type of cross-linking agent is a so-called thermal cross-linking agent that implements a crosslinked structure by application of heat, which is different from a radical cross-linking agent to be described below. A specific example of the isocyanate-based compound may include one or more selected from the group consisting of tolylene diisocyanate, xylene diisocyanate, diphenylmethane diisocyanate, hexamethylene diisocyanate, isoborone diisocyanate, tetramethylxylene diisocyanate, naphthalene diisocyanate and a reactant of any one of the foregoing with a polyol (e.g., trimethylol propane); a specific example of the epoxy-based compound may include one or more selected from the group consisting of ethylene glycol diglycidyl ether, triglycidyl ether, trimethylolpropane triglycidyl ether, N,N,N',N'-tetraglycidyl ethylenediamine and glycerin diglycidyl ether; and a specific example of the aziridine-based compound may include one or more selected from the group consisting of N,N'-toluene-2,4-bis (1-aziridinecarboxamide), N,N'-diphenylmethane-4,4'-bis (1-aziridinecarboxamide), triethylene melamine, bisisoprotaloyl-1-(2-methylaziridine) and tri-1-aziridinylphosphine oxide, but is not limited thereto. In addition, here, a specific example of the metal chelate-based compound may include a compound or the like in which a polyvalent metal such as aluminum, iron, zinc, tin, titanium, antimony, magnesium and/or vanadium is coordinated with acetyl acetone or ethyl acetoacetate, and the like, but is not limited thereto.

In the pressure-sensitive adhesive layer, the cross-linking agent may be included in an amount of 0.01 parts by weight to 10 parts by weight or 0.01 parts by weight to 5 parts by weight relative to 100 parts by weight of the acrylic copolymer. In the above range, it may be adjusted in consideration of the cohesive force and durability of the pressure-sensitive adhesive layer, and the like. In one example, the ratio of the cross-linking agent may be about 0.05 parts by weight or more, about 0.1 parts by weight or more, about 0.15 parts by weight or more, about 0.2 parts by weight or more, or about 0.25 parts by weight or more, or may also be about 4 parts by weight or less, about 3 parts by weight or less, about 2 parts by weight or less, about 1 part by weight or less, about 0.8 parts by weight or less, about 0.6 parts by weight or less, or about 0.4 parts by weight or less or so.

The pressure-sensitive adhesive layer may comprise, as the cross-linking agent, a so-called radical cross-linking agent of a different type from the thermal cross-linking agent. Such a cross-linking agent implements a cross-linked structure by the radical reaction. As such a radical cross-linking agent, a so-called polyfunctional acrylate may be exemplified, and for example, it may include a bifunctional acrylate such as 1,4-butanediol di (meth) acrylate, 1,6-hexanediol di(meth) acrylate, neopentylglycol di(meth) acrylate, polyethylene glycol di(meth) acrylate, neopentyl glycol adipate di (meth) acrylate, hydroxypivalic acid neopentyl glycol di(meth) acrylate, dicyclopentanyl di (meth) acrylate, caprolactone-modified dicyclopentenyl di (meth) acrylate, ethylene oxide-modified di (meth) acrylate, di (meth) acryloxyethyl isocyanurate, allylated cyclohexyl di (meth) acrylate, tricyclodecanedimethanol (meth) acrylate, dimethylol dicyclopentane di (meth) acrylate, ethylene oxide-modified hexahydrophthalic acid di (meth) acrylate, tricyclodecane dimethanol (meth) acrylate, neopentyl glycol-modified trimethylpropane di (meth) acrylate, adamantane di (meth) acrylate or 9,9-bis [4-(2-acryloyloxyethoxy) phenyl]fluorene; a trifunctional acylate such as trimethylolpropane tri (meth) acrylate, dipentaerythritol tri (meth) acrylate, propionic acid modified dipentaerythritol tri (meth) acrylate, pentaerythritol tri (meth) acrylate, propylene oxide modified trimethylolpropane tri (meth) acrylate, trifunctional urethane (meth) acrylate or tris (meth) acryloxyethyl isocyanurate; a tetrafunctional acrylate such as diglycerin tetra (meth) acrylate or pentaerythritol tetra(meth) acrylate; a pentafunctional acrylate such as propionic acid-modified dipentaerythritol penta (meth) acrylate; and a hexafunctional acylate such as dipentaerythritol hexa (meth) acrylate, caprolactone-modified dipentaerythritol hexa (meth) acrylate or urethane (meth) acrylate (e.g., a reactant of an isocyanate monomer and trimethylol propane tri (meth) acrylate), but is not limited thereto.

In the pressure-sensitive adhesive layer, the radical cross-linking agent may also be present in an appropriate ratio depending on the purpose, which may be included, for example, in an amount of 0.01 parts by weight to 10 parts by weight or 0.01 parts by weight to 5 parts by weight relative to 100 parts by weight of the acrylic copolymer.

However, the radical cross-linking agent does not correspond to an essential component. That is, for the formation of the desired first and second regions, the radical cross-linking agent may not be included in the pressure-sensitive adhesive layer.

In addition to the above components, the pressure-sensitive adhesive layer may comprise appropriate additional components as needed, and for example, may also further comprise components such as a radical initiator or an ultraviolet absorber, a light stabilizer and a plasticizer.

The thickness of such a pressure-sensitive adhesive layer in the present application is not particularly limited, which may be a thickness of a conventional pressure-sensitive adhesive layer in consideration of the applied use.

The present application also relates to a pressure-sensitive adhesive film or an optical laminate comprising a base film and the pressure-sensitive adhesive layer formed on one side or both sides of the base film.

That is, the pressure-sensitive adhesive layer of the present application may be formed on one side or both sides of the base film to form a pressure-sensitive adhesive film, or may be formed on one side or both sides of the base film, which is an optical film, to form an optical laminate.

At this time, the type of the base film that can be applied is not particularly limited. As the base film, a base film that can be usually applied to the formation of the pressure-sensitive adhesive film can be applied.

For example, as the base film, a PET (poly (ethylene terephthalate)) film, a PTFE (poly (tetrafluoroethylene)) film, a PP (polypropylene) film, a PE (polyethylene) film, a polyimide film, a polyamide film, a COP (cyclic olefin polymer) film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film and/or a polyimide film may be used, without being limited thereto.

The thickness of such a base film is not particularly limited, which may be an appropriate thickness within a range suitable for the purpose.

In addition, if the optical film is applied as the base film, the type of the optical film is also not particularly limited. In one example, the optical film may be a polarizing film, a polarizing plate or a retardation film, and the like. Even in this case, the optical film may have a thickness in an appropriate range depending on the purpose.

Also, the pressure-sensitive adhesive film or the optical laminate may further comprise a release film or a protective film for protecting the pressure-sensitive adhesive layer until use, if necessary.

The present application also relates to a flexible device comprising the pressure-sensitive adhesive layer, the pressure-sensitive adhesive film or the optical laminate. There is no particular limitation on the application form of the pressure-sensitive adhesive layer, the pressure-sensitive adhesive film or the optical laminate in the device. For example, the pressure-sensitive adhesive layer may be used for the use of a so-called OCA (optically clear adhesive) or OCR (optically clear resin) in the device, and thus the application form of the pressure-sensitive adhesive layer, the pressure-sensitive adhesive film or the optical laminate may be the same as the application form of the conventional OCA or OCR.

In this case, in one example, the flexible device may comprise a display panel and the pressure-sensitive adhesive layer, pressure-sensitive adhesive film or optical laminate present on one side or both sides of the display panel. In this case, the display panel may be configured to be folded or rolled through one or more folding axes or rolling axes. Also, in this case, the pressure-sensitive adhesive layer may be included in the device so that the above-described second region may overlap with the folding axis or the rolling axis.

Here, the matter that the second region overlaps with the folding axis or the rolling axis may mean that the second region overlaps with the folding axis or the rolling axis by observing the display surface of the display panel from the front.

Other elements constituting such a flexible device are not particularly limited, and well-known components of the flexible device may be adopted without limitation.

Advantageous Effects

The present application may provide a pressure-sensitive adhesive layer comprising at least first and second regions having different physical properties, wherein the difference in physical properties, such as an elastic modulus or creep strain rate, which are advantageous as the difference in physical properties between the regions increases, is maintained relatively large for each region, and the difference in physical properties, such as a peel force or recovery rate, which are advantageous as the difference in physical properties between the regions decreases, is maintained relatively small for each region.

The present application may provide a pressure-sensitive adhesive layer, wherein such first and second regions are formed of a pressure-sensitive adhesive having the same composition.

The present application may also provide a pressure-sensitive adhesive for a flexible device such as a foldable device or a rollable device.

MODE FOR INVENTION

Hereinafter, the present application will be described in detail through Examples, but the scope of the present application is not limited by Examples below.

1. Evaluation of Storage Elastic Modulus

The storage elastic modulus was evaluated using ARES G2 (Advanced Rheometric Expansion System G2) (TA). A specimen was prepared by cutting a pressure-sensitive adhesive layer having a thickness of about 0.8 mm or so into a circle having a diameter of about 8 mm or so. The pressure-sensitive adhesive layer was prepared by overlapping the pressure-sensitive adhesive layer having a thickness of about 25 $\mu$m or so to a thickness of about 0.8 mm or so. The storage elastic modulus at the measurement temperature was evaluated for the specimen using a parallel plate fixture having a diameter of about 8 mm. Upon the evaluation, the evaluation conditions were a frequency of 1 Hz and a strain of 5%.

2. Evaluation of Creep Strain Rate and Recovery Rate

The creep strain rate and recovery rate were evaluated in the following manner. A specimen was prepared by cutting a pressure-sensitive adhesive layer having a thickness of about 0.8 mm or so into a circle having a diameter of about 8 mm or so. The pressure-sensitive adhesive layer was prepared by overlapping the pressure-sensitive adhesive layer having a thickness of about 25 $\mu$m or so to a thickness of about 0.8 mm or so.

Figure 9:
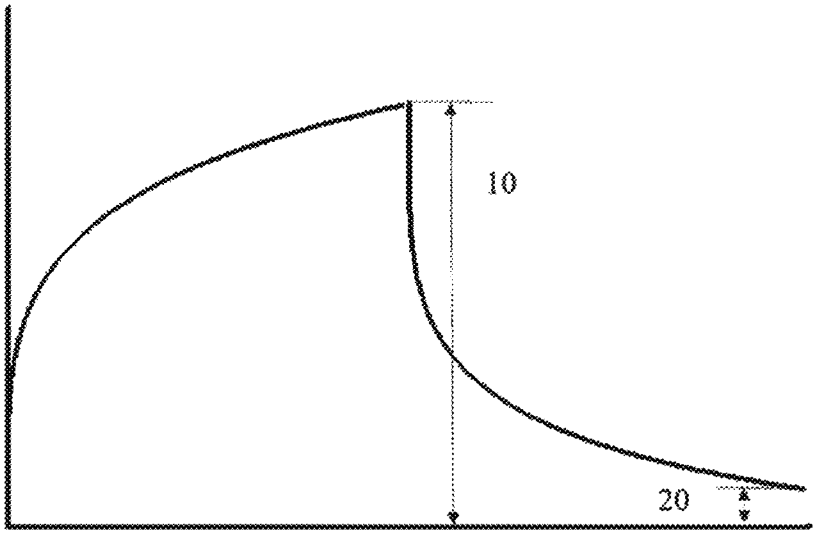
FIG. 9 is a diagram exemplarily expressing a graph used in a process of measuring creep strain rates and recovery rates.

Using ARES G2 (Advanced Rheometric Expansion System G2) (TA) equipment, the specimen was mounted on a parallel plate fixture having a diameter of about 8 mm, and a stress of about 10,000 Pa or so in the shear direction was applied to the specimen for 600 seconds, and the strain rate after removing the stress was confirmed as shown in FIG. 9 and evaluated.

In the graph of FIG. 9, the x-axis is an axis showing the lapse of time that the time point when the stress starts to be applied is set to 0 seconds, and the y-axis is an axis showing the strain (%) of the pressure-sensitive adhesive layer, where the stain is a result of calculation according to Equation A below.

$$\text{Stain (unit: \%)}=100\times(L_a-L_i)/L_i \qquad \text{[Equation A]}$$

In Equation A, La is the length (unit: mm) after deformation of the pressure-sensitive adhesive layer in the deformation direction (direction to which stress is applied), and Li is the initial thickness (unit: mm) of the pressure-sensitive adhesive layer before deformation.

The maximum strain (10 in FIG. 9) of the pressure-sensitive adhesive layer confirmed by such evaluation was designated as the creep strain rate value.

In addition, the recovery rate was designated according to Equation B below.

$$R\%=100\times(C-S)/C \qquad \text{[Equation B]}$$

In Equation B, R % is the recovery rate, C is the creep strain rate value (Creep, maximum strain rate), and S is the strain rate (e.g., 20 in FIG. 9) of the specimen at the time that the stress of about 10,000 Pa has been applied to the specimen for 600 seconds and then the stress has been removed, and again 600 seconds have elapsed.

3. Peel Force Evaluation

A specimen was prepared by cutting the pressure-sensitive adhesive film (the structure of the release film/pressure-sensitive adhesive layer/base film) to be measured into a rectangle having a width of about 25 mm or so and a length of about 100 mm or so. Subsequently, the release film was peeled off, and the pressure-sensitive adhesive layer was attached to soda lime glass or a polyimide film using a roller of 2 kg according to the regulations of JIS Z 0237 and left at room temperature for 1 day. Thereafter, the peel force was measured while peeling the pressure-sensitive adhesive layer at a peel angle of 180 degrees and a peel rate of 0.3m/min at room temperature using a TA (Texture Analyzer) equipment (Stable Micro System).

4. Evaluation of Melting Point and Glass Transition Temperature

The melting point and glass transition temperature of the copolymer were measured according to a measurement method using a conventional DSC (differential scanning calorimeter) equipment. As the equipment, DSC-STAR3 equipment (Mettler Toledo) was used. About 10 mg of the sample (copolymer) was sealed in a dedicated pan, and the melting point and the like were measured by checking the endothermic and calorific values according to the temperature under a temperature increase condition of 10° C./min.

5. Evaluation of Weight Average Molecular Weight

The weight average molecular weight (Mw) of the copolymer was measured using GPC (gel permeation chromatograph), and the measurement conditions were as follows. When measuring the weight average molecular weight, standard polystyrene (manufactured by Agilent System) was used to prepare the calibration curve, and the measurement results were converted.

<GPC Measurement Conditions>

Measuring instrument: Agilent GPC (Agilent 1200 series, U.S.)

Column: Connecting two PL Mixed B

Column temperature: 40° C.

Eluent: Tetrahydrofuran (THF)

Flow rate: 1.0 μL/min

Concentration: ~1 mg/mL (100 μl injection)

6. Dynamic Folding Test

Figure 10:
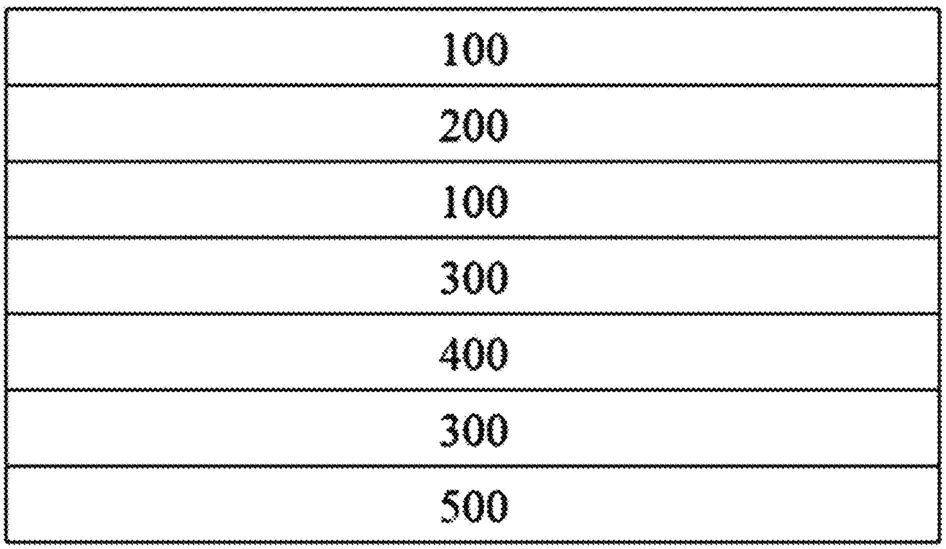
FIG. 10 is a diagram showing the structure of a specimen applied in a dynamic folding test.
Figure 11:
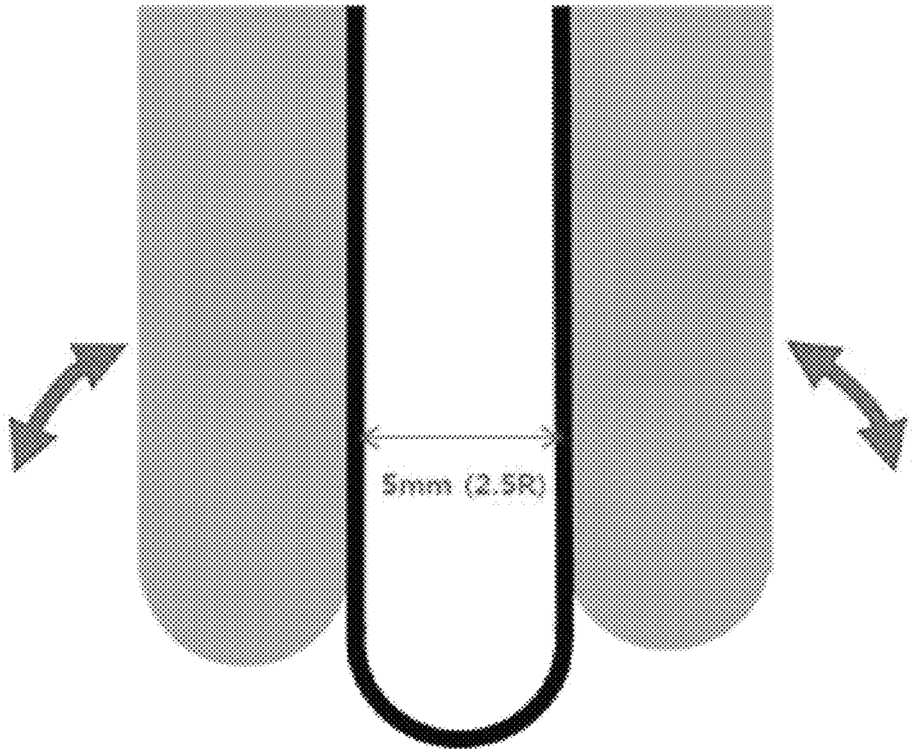
FIG. 11 is a diagram showing a process in which a dynamic folding test is performed.

The dynamic folding test was performed by preparing a specimen as shown in FIG. 10. As the specimen shown in FIG. 10, a laminate prepared by sequentially laminating a polyimide film (200) having a thickness of about 50 μm or so, in which a hard coating layer (100) was formed on both sides, a pressure-sensitive adhesive layer (300), a polarizing plate (400), a pressure-sensitive adhesive layer (300) and a display panel (500) was cut in a rectangular shape having a horizontal length of about 7.8 cm and a vertical length of about 17 cm or so to prepare a specimen. Subsequently, as shown in FIG. 11, the folding that the specimen was sandwiched between parallel plates at an interval of 5 mm and folded was repeated 200,000 times at 25° C., and after collecting the sample, defects such as occurrence of bubbles and occurrence of lifting/peeling in the sample, and crack occurrence of the hard coating layer were visually observed. The case where even one of the above defects occurred was evaluated as NG, and the case where all of the above defects did not occur was evaluated as PASS.

Preparation Example 1. Preparation of Copolymer (A)

2-ethylhexyl acrylate (2-EHA), lauryl acrylate (LA), 4-hydroxybutyl acrylate (HBA) and 4-benzoylphenyl methacrylate (BPMA) were introduced into ethyl acetate as a solvent in a reactor in a weight ratio (2-EHA: LA: HBA: BPMA) of 50:40:10:0.05, about 500 ppm of a radical initiator (2,2'-azobis (4-methoxy-2,4-dimethylvaleronitrile)) was added thereto, and then, the mixture was polymerized at about 50° C. for about 8 hours to prepare a polymer substance (copolymer (A)).

In addition, the copolymer (polymer substance) (A) had a glass transition temperature (Tg) of about −60° C. or so and a melting point of about −40° C. or so.

Preparation Examples 2 to 16. Preparation of Copolymers

Copolymers (polymer substances) were prepared in the same manner as in Preparation Example 1, except that the weight ratios of the applied monomers and the weight average molecular weights of the polymer substances (copolymers) were as shown in Table 1 below.

TABLE 1

| | Co-polymer | 2-EHA | LA | HBA | BPMA | Mw | Tg | Tm |
|---|---|---|---|---|---|---|---|---|
| Preparation Example 1 | A | 50 | 40 | 10 | 0.05 | 1990000 | −60 | −40 |
| Preparation Example 2 | B | 40 | 40 | 20 | 0.01 | 1970000 | −60 | −44 |
| Preparation Example 3 | C | 40 | 40 | 20 | 0.03 | 1890000 | −56 | −44 |
| Preparation Example 4 | D | 40 | 40 | 20 | 0.05 | 2030000 | −61 | −43 |
| Preparation Example 5 | E | 40 | 40 | 20 | 0.1 | 1990000 | −54 | −44 |

2-EHA: 2-ethylhexyl acrylate
LA: lauryl acrylate
HBA: 4-hydroxybutyl acrylate
BPMA: 4-benzoylphenyl methacrylate
Mw: weight average molecular weight (unit: g/mol)
Tg: glass transition temperature (unit: ° C.)
Tm: melting point (unit: ° C.)

Example 1

A pressure-sensitive adhesive composition was prepared by formulating about 0.3 parts by weight of an isocyanate cross-linking agent (xylylene diisocyanate) relative to 100 parts by weight of the copolymer (polymer substance) (A) of Preparation Example 1. The prepared pressure-sensitive adhesive composition was applied on a base film (PET (poly (ethylene terephthalate)) with a comma coater, and maintained at 130° C. for about 3 minutes or so to form a pressure-sensitive adhesive layer having a thickness of about 25 μm or SO.

Example 2

A pressure-sensitive adhesive layer was formed in the same manner as in Example 1, except that the copolymer (polymer substance) (B) of Preparation Example 2 was used instead of the copolymer (polymer substance) (A) of Preparation Example 1.

Example 3

A pressure-sensitive adhesive layer was formed in the same manner as in Example 1, except that the copolymer (polymer substance) (C) of Preparation Example 3 was used instead of the copolymer (polymer substance) (A) of Preparation Example 1.

Example 4

A pressure-sensitive adhesive layer was formed in the same manner as in Example 1, except that the copolymer (polymer substance) (D) of Preparation Example 4 was used instead of the copolymer (polymer substance) (A) of Preparation Example 1.

Example 5

A pressure-sensitive adhesive layer was formed in the same manner as in Example 1, except that the copolymer (polymer substance) (E) of Preparation Example 5 was used instead of the copolymer (polymer substance) (A) of Preparation Example 1.

Test Example 1. Evaluation of Creep Strain Rate and Recovery Rate

For the pressure-sensitive adhesive layers, creep strain rates and recovery rates in the case where ultraviolet rays were irradiated and the case where ultraviolet rays were not irradiated were evaluated, respectively, and the results were described in Tables 2 and 3 below.

Here, the irradiation of ultraviolet rays in the above was performed by irradiating the pressure-sensitive adhesive layer with ultraviolet rays at a light quantity of about 3,600mJ/$cm^2$ or so as a light source of Fusion D-bulb equipment.

TABLE 2

| | Region not irradiated with ultraviolet rays | | Region irradiated with ultraviolet rays | |
|---|---|---|---|---|
| | Creep strain rate (60° C.) (%) | Recovery rate (60° C.) (%) | Creep strain rate (60° C.) (%) | Recovery rate (60° C.) (%) |
| Example 1 | 378.1 | 92.4 | 107.1 | 96.7 |
| Example 2 | 360.3 | 93.9 | 183.8 | 95.4 |
| Example 3 | 515.2 | 91.9 | 131.2 | 93 |
| Example 4 | 510.9 | 93.4 | 101 | 97.4 |
| Example 5 | 490.4 | 93.2 | 74.7 | 98.4 |

TABLE 3

| | Region not irradiated with ultraviolet rays | | Region irradiated with ultraviolet rays | |
|---|---|---|---|---|
| | Creep strain rate (−20° C.) (%) | Recovery rate (−20° C.) (%) | Creep strain rate (−20° C.) (%) | Recovery rate (−20° C.) (%) |
| Example 1 | 116.4 | 84.1 | 81.1 | 90.5 |
| Example 2 | 68.2 | 84.8 | 61.3 | 86.4 |
| Example 3 | 70.2 | 83.2 | 59.3 | 87.6 |
| Example 4 | 68.5 | 83 | 55.7 | 88.7 |
| Example 5 | 74.4 | 82.4 | 52 | 90.5 |

In the case of Examples 1 to 5, the difference in creep strain rates according to Equations 1 and 3 and the difference in recovery rates according to Equations 2 and 4 are as summarized in Table 4 below.

TABLE 4

| | Creep strain rate difference (Equation1) $D_{C60}$ (60° C.) (%) | Creep strain rate difference (Equation 3) $D_{CM20}$ (−20° C.) (%) | Recovery rate difference (Equation 2) $D_{R60}$ (60° C.) (%) | Recovery rate difference (Equation 4) $D_{RM20}$ (−20° C.) (%) |
|---|---|---|---|---|
| Example 1 | −71.7 | −30.3 | 4.7 | 7.6 |
| Example 2 | −49 | −10.1 | 1.6 | 1.9 |
| Example 3 | −74.5 | −15.5 | 4.5 | 5.2 |

TABLE 4-continued

| | Creep strain rate difference (Equation1) $D_{C60}$ (60° C.) (%) | Creep strain rate difference (Equation 3) $D_{CM20}$ (−20° C.) (%) | Recovery rate difference (Equation 2) $D_{R60}$ (60° C.) (%) | Recovery rate difference (Equation 4) $D_{RM20}$ (−20° C.) (%) |
|---|---|---|---|---|
| Example 4 | −80.2 | −18.7 | 4.3 | 6.9 |
| Example 5 | −84.8 | −30.1 | 5.6 | 9.8 |

From the results of Tables 2 to 4, it can be confirmed that the pressure-sensitive adhesive layer according to the present application shows a relatively large difference in creep strain rates in the region irradiated with ultraviolet rays and in the other region, and simultaneously the difference in recovery rates is controlled to be relatively small. Accordingly, it can be confirmed that for example, when the pressure-sensitive adhesive layer of the present application is applied to a pattern exposure technique with a mask applied as disclosed in Patent Document 1, it can form a multi-region pressure-sensitive adhesive layer in which the difference in recovery rates is maintained relatively small while the difference in creep strain rates is maintained large.

Test Example 2. Evaluation of Storage Elastic Modulus and Peel Force

For the pressure-sensitive adhesive layers of Examples and Comparative Examples, the storage elastic moduli and peel force in the case where ultraviolet rays were irradiated and the case where they were not irradiated were evaluated, respectively, and the results were described in Tables 5 and 6 below. Here, the irradiation of ultraviolet rays was performed in the same manner as in Test Example 1. In the following, the unit of storage elastic modulus is Pa.

TABLE 5

| | Storage elastic modulus (−20° C.) | | Storage elastic modulus (30° C.) | | Storage elastic modulus (60° C.) | |
|---|---|---|---|---|---|---|
| | Ultraviolet irradiation | No ultraviolet irradiation | Ultraviolet irradiation | No ultraviolet irradiation | Ultraviolet irradiation | No ultraviolet irradiation |
| Example 1 | 68674 | 65169 | 23260 | 20628 | 16658 | 12795 |
| Example 2 | 117571 | 119014 | 27735 | 26268 | 19469 | 17429 |
| Example 3 | 125143 | 112915 | 28547 | 24963 | 20760 | 16464 |
| Example 4 | 133564 | 115601 | 29438 | 25475 | 22275 | 16375 |
| Example 5 | 105493 | 113616 | 27904 | 24070 | 22571 | 15239 |

TABLE 6

| | Peel force to glass (gf/inch) | | Peel force to glass (gf/inch) | |
|---|---|---|---|---|
| | Ultraviolet irradiation | No ultraviolet irradiation | Ultraviolet irradiation | No ultraviolet irradiation |
| Example 1 | 1138 | 1168 | 1028 | 1279 |
| Example 2 | 1197 | 1227 | 1149 | 1213 |
| Example 3 | 1210 | 1426 | 1152 | 1258 |

TABLE 6-continued

| | Peel force to glass (gf/inch) | | Peel force to glass (gf/inch) | |
|---|---|---|---|---|
| | Ultraviolet irradiation | No ultraviolet irradiation | Ultraviolet irradiation | No ultraviolet irradiation |
| Example 4 | 1167 | 1397 | 1085 | 1287 |
| Example 5 | 1030 | 1410 | 982 | 1259 |

Differences in storage elastic moduli of the first and second regions in the pressure-sensitive adhesive layer of Examples 1 to 5 according to Equations 5 to 7 according to Equations 5 to 7 are as summarized in Table 7 below, and differences of peel force according to Equations 8 and 9 are as summarized in Table 8 below.

TABLE 7

| | Storage elastic modulus difference | | |
|---|---|---|---|
| | Equation 4, $D_{M60}$ (60° C.) (%) | Equation 5, $D_{M30}$ (30° C.) (%) | Equation 6, $D_{M20}$ (−20° C.) (%) |
| Example 1 | 30.2 | 12.8 | 5.4 |
| Example 2 | 11.7 | 5.6 | −1.2 |
| Example 3 | 26.0 | 14.4 | 10.8 |
| Example 4 | 36.0 | 15.6 | 15.5 |
| Example 5 | 48.1 | 15.9 | −7.1 |

TABLE 8

| | Difference of peel force | |
|---|---|---|
| | Equation 8, $D_{PG}$ (%) | Equation 9, $D_{PI}$ (%) |
| Example 1 | −2.6 | −19.6 |
| Example 2 | −2.4 | −5.3 |
| Example 3 | −15.1 | −8.4 |
| Example 4 | −16.4 | −15.7 |
| Example 5 | −27.0 | −22.0 |

From the results of Tables 5 to 8, it can be confirmed that the pressure-sensitive adhesive layer according to the present application shows a relatively large difference in storage elastic moduli in the region irradiated with ultraviolet rays and in the other region, and simultaneously the difference in peel force is controlled to be relatively small. Accordingly, it can be confirmed that for example, when the pressure-sensitive adhesive layer of the present application is applied to a pattern exposure technique with a mask applied as disclosed in Patent Document 1, it can form a multi-region pressure-sensitive adhesive layer in which the difference in peel force is maintained relatively small while the difference in storage elastic moduli is maintained large.

Test Example 3. Dynamic Folding Test

Figure 1:
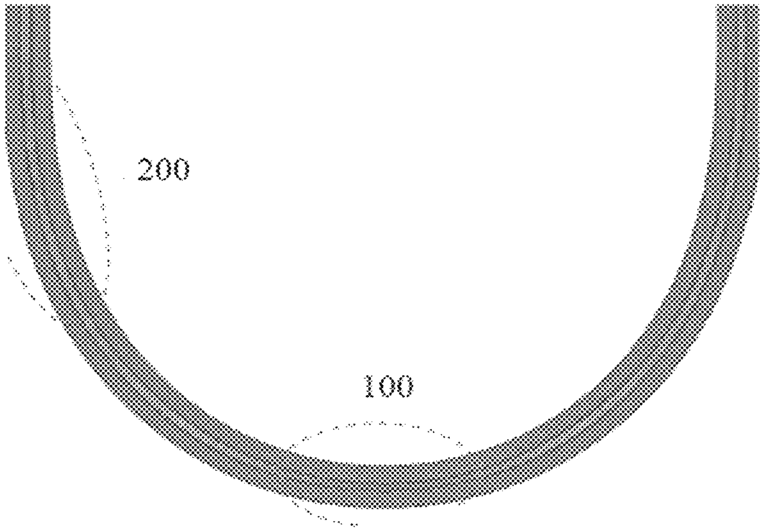
FIG. 1 is an exemplary diagram for explaining deformation according to stress generated upon folding in a foldable device.
Figure 2:
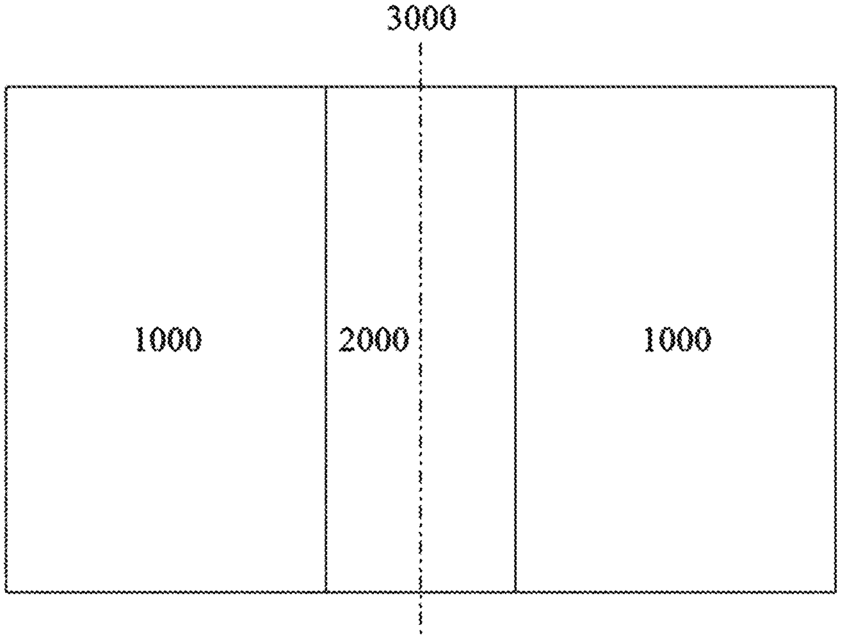
FIGS. 2 to 5 are diagrams exemplarily showing the formation form of first and second regions in a pressure-sensitive adhesive layer.
Figure 3:
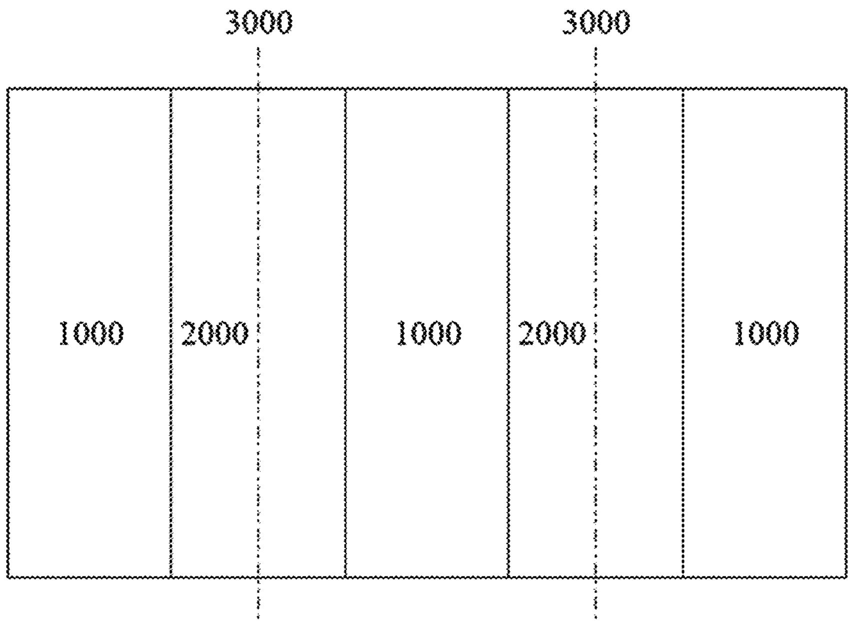
Figure 4:
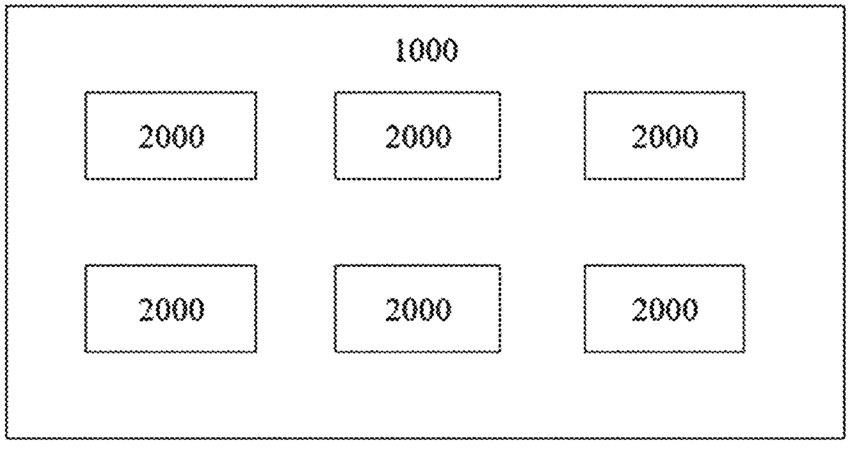
Figure 5:
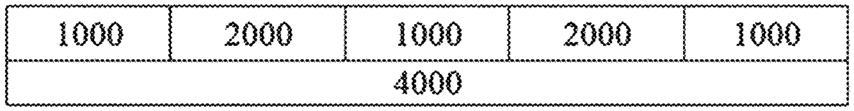
Figure 6:
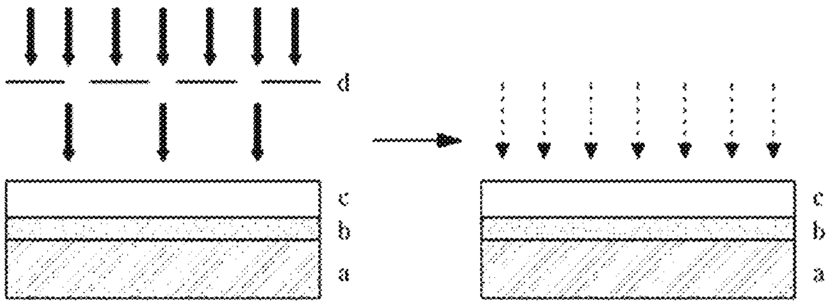
FIGS. 6 to 8 are diagrams schematically expressing an electromagnetic wave irradiation process for forming a pressure-sensitive adhesive layer.
Figure 7:
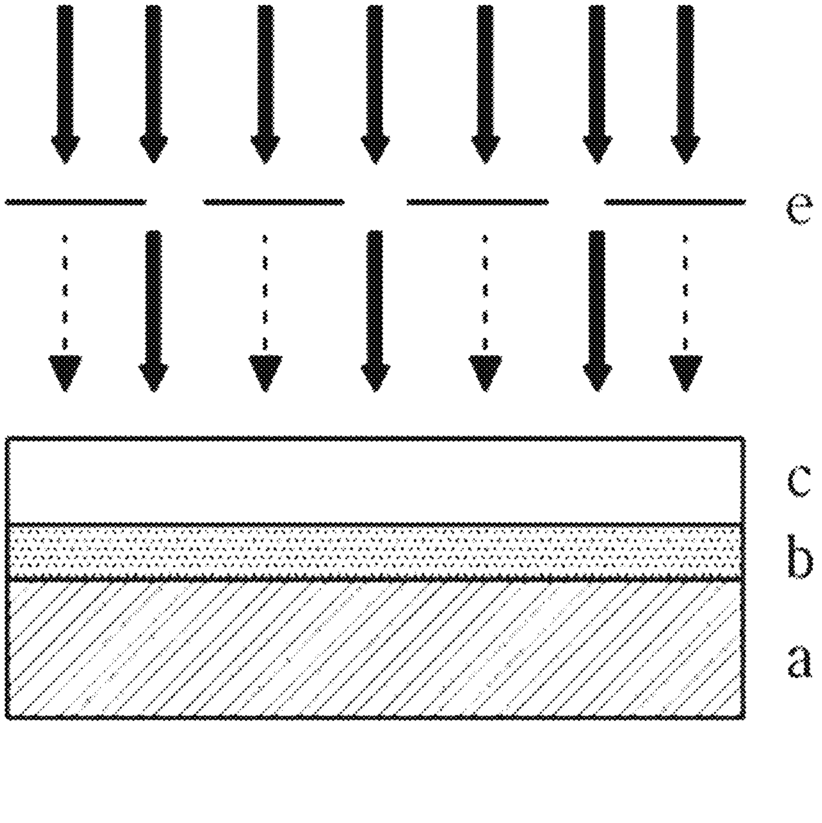
Figure 8:
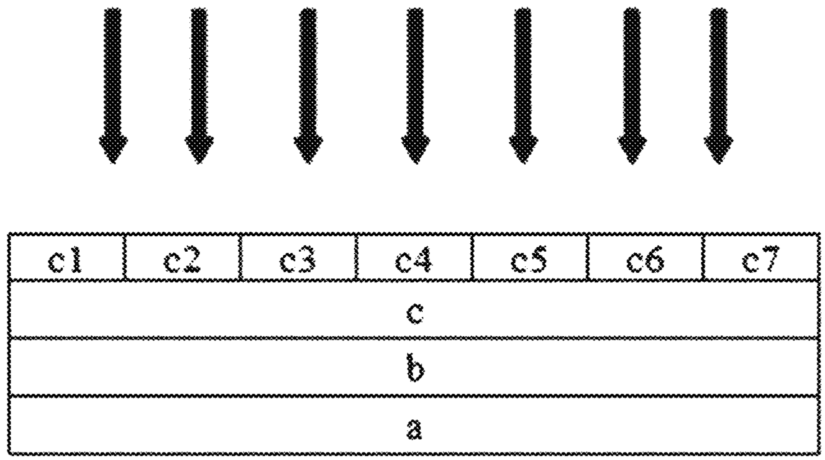

The first region (1000) and the second region (2000) as shown in FIG. 2 were formed on each pressure-sensitive adhesive layer of Examples by ultraviolet irradiation via a mask, and a dynamic folding test was performed in the above-described manner. In the dynamic folding test, the folding axis (3000) overlapped the center of the second region (2000) as shown in FIG. 2. As a result, in the case of all the pressure-sensitive adhesive layers of Examples, no defect appeared after repeated folding, and no folding mark was observed after folding.

The invention claimed is:

1. A pressure-sensitive adhesive layer, comprising:

a first region and a second region, wherein an absolute value of a difference in storage elastic moduli of the first and second regions according to Equation 5 below is 10% or more, and wherein an absolute value of a difference in peel forces of the first and second regions according to Equation 8 below is 40% or less, and wherein the pressure-sensitive adhesive layer comprises a crystalline acrylic copolymer having a melting point of −20° C. or less:

$$D_{M60}=100\times(M_{60.1}-M_{60.2})/M_{60.2} \quad \text{[Equation 5]}$$

$$D_{PG}=100\times(P_{G,1}-P_{G,2})/P_{G,2} \quad \text{[Equation 8]}$$

wherein, $D_{M60}$ is the difference in the storage elastic moduli, $M_{60.1}$ is a storage elastic modulus of the first region at 60° C., and $M_{60.2}$ is a storage elastic modulus of the second region at 60° C.; and $D_{PG}$ is the difference in the peel force, $P_{G,1}$ is a peel force of the first region to a glass, and $P_{G,2}$ is a peel force of the second region to the glass.

2. The pressure-sensitive adhesive layer according to claim 1, wherein the storage elastic modulus of the second region at 60° C. is 50,000 Pa or less.

3. The pressure-sensitive adhesive layer according to claim 1, wherein an absolute value of a difference in storage elastic moduli of the first and second regions according to Equation 6 below is 3% or more:

$$D_{M30}=100\times(M_{30.1}-M_{30.2})/M_{30.2} \quad \text{[Equation 6]}$$

wherein, $D_{M30}$ is the difference in the storage elastic moduli, $M_{30.1}$ is a storage elastic modulus of the first region at 30° C., and $M_{30.2}$ is a storage elastic modulus of the second region at 30° C.

4. The pressure-sensitive adhesive layer according to claim 3, wherein the storage elastic modulus of the second region at 30° C. is 50,000 Pa or less.

5. The pressure-sensitive adhesive layer according to claim 1, wherein an absolute value of a difference in storage elastic moduli of the first and second regions according to Equation 7 below is 1% or more:

$$D_{M20}=100\times(M_{20.1}-M_{20.2})/M_{20.2} \quad \text{[Equation 7]}$$

wherein, $D_{M20}$ is the difference in the storage elastic moduli, $M_{20.1}$ is a storage elastic modulus of the first region at −20° C., and $M_{20.2}$ is a storage elastic modulus of the second region at −20° C.

6. The pressure-sensitive adhesive layer according to claim 5, wherein the storage elastic modulus of the second region at −20° C. is 500,000 Pa or less.

7. The pressure-sensitive adhesive layer according to claim 1, wherein the peel force of the first region to a glass is at least 500 gf/inch.

8. The pressure-sensitive adhesive layer according to claim 1, wherein an absolute value of a difference in peel force of the first and second regions according to Equation 9 below is 50% or less:

$$D_{PI}=100\times(P_{I,1}-P_{I,2})/P_{I,2} \quad \text{[Equation 9]}$$

wherein, $D_{PI}$ is the difference in the peel force, $P_{I,1}$ is a peel force of the first region to a polyimide film, and $P_{I,2}$ is the peel force of the second region to a polyimide film.

9. The pressure-sensitive adhesive layer according to claim 8, wherein the peel force of the first region to a polyimide film is at least 500 gf/inch.

10. A pressure-sensitive adhesive film, comprising:

a base film; and the pressure-sensitive adhesive layer of claim 1 formed on one side or both sides of the base film.

11. An optical laminate, comprising:

an optical film; and the pressure-sensitive adhesive layer of claim 1 formed on one side or both sides of the optical film.

* * * * *